US006680874B1

United States Patent
Harrison

(10) Patent No.: US 6,680,874 B1
(45) Date of Patent: Jan. 20, 2004

(54) DELAY LOCK LOOP CIRCUIT USEFUL IN A SYNCHRONOUS SYSTEM AND ASSOCIATED METHODS

(75) Inventor: Ronnie M. Harrison, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/230,750

(22) Filed: Aug. 29, 2002

(51) Int. Cl.$^7$ .............................. G11C 8/00; H03L 7/06
(52) U.S. Cl. .................. 365/233; 365/189.05; 327/156; 327/157; 327/158
(58) Field of Search ........................... 365/189.05, 233; 327/156, 157, 158, 159

(56) References Cited

U.S. PATENT DOCUMENTS

| | | | |
|---|---|---|---|
| 4,902,986 A | 2/1990 | Lesmeister | 331/25 |
| 5,920,518 A | 7/1999 | Harrison et al. | 365/233 |
| 5,926,047 A | 7/1999 | Harrison | 327/159 |
| 5,940,609 A | 8/1999 | Harrison | 395/558 |
| 6,011,732 A | 1/2000 | Harrison et al. | 365/194 |
| 6,069,506 A | 5/2000 | Miller et al. | 327/156 |
| 6,173,432 B1 | 1/2001 | Harrison | 716/1 |
| 6,215,726 B1 * | 4/2001 | Kubo | 365/233 |
| 6,316,976 B1 * | 11/2001 | Miller, Jr. et al. | 327/156 |
| 6,424,178 B1 | 7/2002 | Harrison | 326/93 |
| 2001/0015664 A1 * | 8/2001 | Taniguchi | 327/158 |
| 2002/0180500 A1 * | 12/2002 | Okuda et al. | 327/158 |

OTHER PUBLICATIONS

Portmann et al., "A Multiple Vendor 2.5–V DLL for 1.6–GB/s RDRAMs," 1999 Symposium on VLSI Circuits Digest of Technical Papers, No. 15–3, pp. 153–156.
Ishibashi et al., "A High–Speed Clock Distribution Architecture Employing PLL for 0.6$\mu$m CMOS SOG," IEEE 1992 Custom Integrated Circuits Conference, pp. 27.6.1–27.6.4.
Ko et al., "A 30–ps Jitter, 3.6–$\mu$s Locking, 3.3–Volt Digital PLL for CMOS Gate Arrays," IEEE 1993 Custom Integrated Circuits Conference, pp. 23.3.1–23.3.4.
Kim et al., "A 30MHz High–Speed Analog/Digital PLL in 2$\mu$m CMOS," 1990 IEEE International Solid–State Circuits Conference, Session 6: High–Speed Analog, TAM 6.4, pp. 105–105.
Lee et al., "A 2.5 V Delay–Locked Loop for an 18Mb 500MB/s DRAM," 1994 IEEE International Solid–State Circuits Conference, Session 18: High–Performance Logic and Circuit Techniques, Paper FA 18.6, pp. 300–301.
Ljuslin et al., "An Integrated 16–channel CMOS Time to Digital Converter," 1993 IEEE Conference Record: Nuclear Science Symposium & Medical Imaging Conference vol. 1, pp. 625–629.
Shirotori et al., "PLL–based, Impedance Controlled Output Buffer," Toshiba Microelectronics Corp., pp. 49–50.

*Primary Examiner*—Son Mai
(74) *Attorney, Agent, or Firm*—Wong, Cabello, Lutsch, Rutherford & Brucculeri, LLP

(57) ABSTRACT

A method and circuitry for a delay lock loop useful in synchronizing the accessing of a memory array with a system clock is disclosed. In a preferred embodiment, the delay lock loop includes a variable delay element. The delay of the variable delay element is initially set to a minimum delay value. The system clock is then frequency divided and sent to the variable delay element, the output of which will ultimately be used to access the memory array in a synchronized manner with the system clock. The frequency divided clock and the output of the variable delay element are input to a phase detector, which creates a control signal for adjusting the delay of the variable delay element. After the signals are determined to be locked by the phase detector, an undivided clock signal version of the clock signal is sent to the variable delay element, and a frequency divided version of the output of the variable delay element is sent to the phase detector in lieu of the previous output of the variable delay element.

51 Claims, 29 Drawing Sheets

OTHER PUBLICATIONS

Saeki et al., "A 2.5–ns Clock Access, 250–MHz, 256–Mb SDRAM with Synchronous Mirror Delay," Nov. 1996, IEEE Journal of Solid–State Circuits, vol. 31, No. 11, pp. 1656–1665.

Kaenel et al., "A 320 MHz, 1.5m W @ 1.35 V CMOS PLL for Microprocessor Clock Generation," Nov. 1996, IEEE Journal of Solid–State Circuits, vol. 31, No. 11, pp. 1715–1722.

Maneatis, John G., "Low–Jitter Process–Independent DLL and PLL Based of Self–Biased Techniques," Nov. 1996, IEEE Journal of Solid–State Circuits, vol. 31, No. 11, pp. 1723–1732.

Donnelly et al., "A 660 MB/s Interface Megacell Portable Circuit in 0.3 μm–0.7 μm CMOS ASIC," Dec. 1996, IEEE Journal of Solid–State Circuits, vol. 31, No. 12, pp. 1995–2001.

Sidiropoulos et al., "A Semidigital Dual Delay–Locked Loop," Nov. 1997, IEEE Journal of Solid–State Circuits, vol. 32, No. 11, pp. 1683–1692.

Goto et al., "A PLL–Based Programmable Clock Generator with 50 to 350 MHz Oscillating Range for Video Signal Processors," IEICE Trans. Electron., Dec. 1994, vol. E77–C, No. 12, pp. 1951–1956.

Alvarez et al., "A Wide–Bandwidth Low–Voltage PLL for PowerPC™ Microprocessors," IEICE Trans. Electron., Jun. 1995, vol. E78–C, No. 6, pp. 631–639.

Tanoi et al., "A 250–622 Mhz Deskew and Jitter–Suppressed Clock Buffer Using Two–Loop Architecture," IEICE Trans. Electron., Jul. 1996, vol. E79–C, No. 7, pp. 898–904.

Sidiropoulos et al., "A CMOS 500 Mbps/pin Synchronous Point to Point Link Interface," 1994 Symposium on VLSI Circuits Digest of Technical Papers, No. 4.5, pp. 43–44.

Soyuer et al., "A Fully Monolithic 1.25GHz CMOS Frequency Synthesizer," 1994 Symposium on VLSI Circuits Digest of Technical Papers, No. 11.3, pp. 127–128.

Tanoi et al., "A 250–622 Mhz Deskew and Jitter–Suppressed Clock Buffer Using a Frequency– and Delay–Locked Two–Loop Architecture," 1995 Symposium on VLSI Circuits Digest of Technical Papers, No. 11–2, pp. 85–86.

Nakamura et al., "A 156 Mbps CMOS Clock Recovery Circuit for Burst–mode Transmission," 1996 Symposium on VLSI Circuits Digest of Technical Papers, No. 11.4, pp. 122–123.

U.S. Patent Application Filed Mar. 1, 1999, Ser. No. 09/260,212, Titled "Method And Apparatus For Generating A Phase Dependent Control Signal," Inventor—Harrison, pp. 1–34, 7 drawing sheets.

U.S. Patent Application Filed Feb. 26, 1999, Ser. No. 09/259,625, Titled "Interlaced Delay–Locked Loops For Controlling Memory–Circuit Timing," Inventor—Harrison, pp. 1–29, 11 drawing sheets.

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (SyncLink), " Microprocessor and Microcomputer Standards Subcommittee of the IEEE Computer Society, Copyright 1996 by the Institute of Electrical and Electronics Engineers, Inc., New York, NY, pp. 1–56.

Lesmeister, Gary, "A Densely Integrated High Performance CMOS Tester," International Test Conference 1991, Paper 16.2, pp. 426–429.

Chapman et al., "A Low–Cost High–Performance CMOS Timing Vernier for ATE," International Test Conference, Copyright 1995 IEEE, Paper 21.2, pp. 459–468.

Novof et al., "Fully Integrated CMOS Phase–Locked Loop with 15 to 240 MHz Locking Range and ±50 ps Jitter," Nov. 1995, IEEE Journal of Solid–Phase Circuits, vol. 30, No. 11, pp. 1259–1266.

Christiansen, Jorgen, "An Integrated High Resolution CMOS Timing Generator Based on an Array of Delay Locked Loops," Jul. 1996, IEEE Journal of Solid–State Circuits, vol. 31, No. 7, pp. 952–957.

Combes et al., "A Portable Clock Multiplier Generator Using Digital CMOS Standard Cells," Jul. 1996, IEEE Journal of Solid–State Circuits, vol. 31, No. 7, pp. 958–965.

Yoshimura et al., "A 622–Mb/s Bit/Frame Synchronizer for High–Speed Backplane Data Communication," Jul. 1996, IEEE Journal of Solid–State Circuits, vol. 31, No. 7, pp. 1063–1066.

U.S. Patent Application Filed Jun. 28, 2001, Ser. No. 09/896,030, Titled "Method And System For Adjusting The Timing Offset Between A Clock Signal And Respective Digital Signals Transmitted Along With That Clock Signal, And Memory Device And Computer System Using Same," Inventor—Harrison et al., pp. 1–55, 7 drawing sheets.

\* cited by examiner

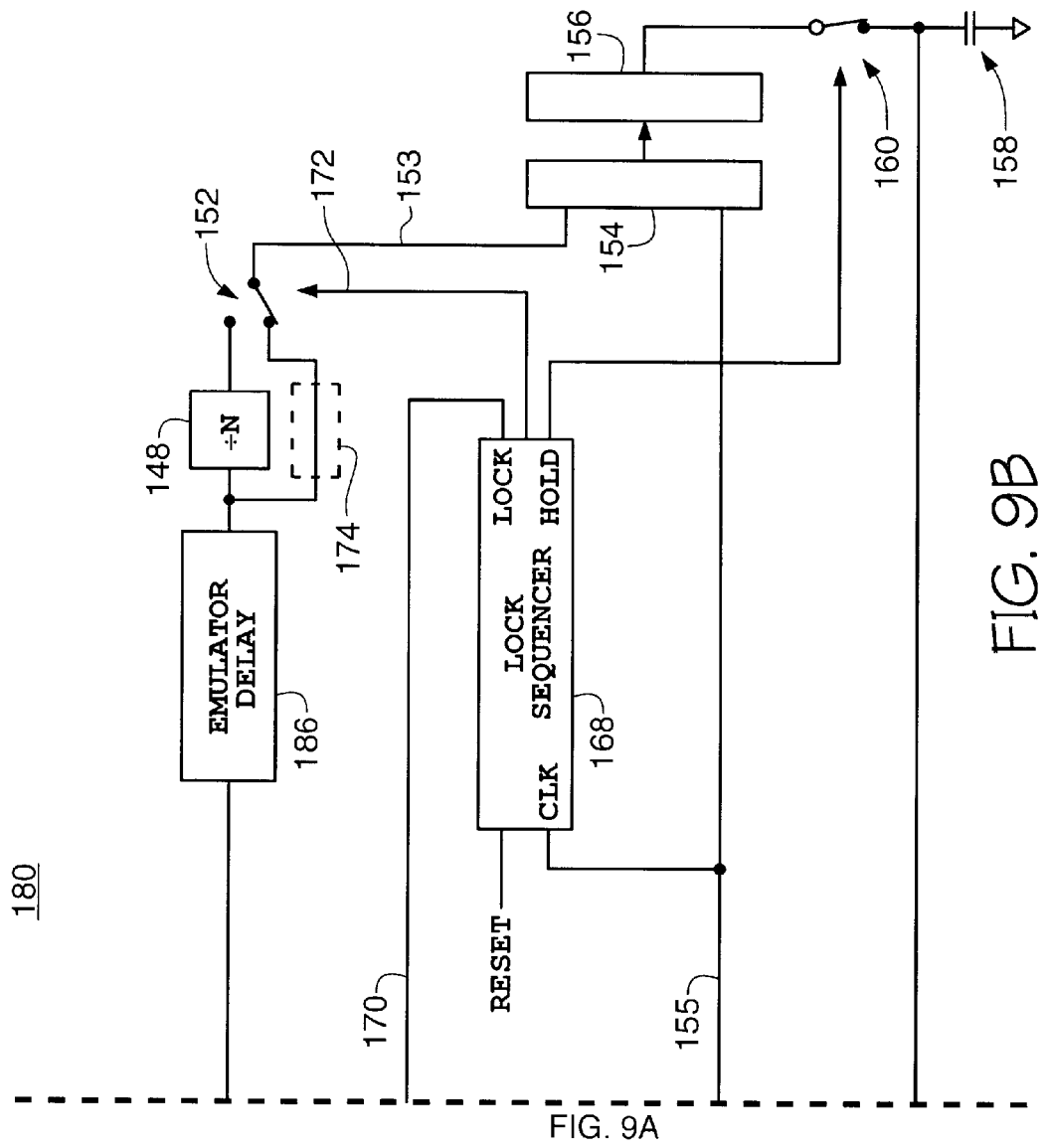

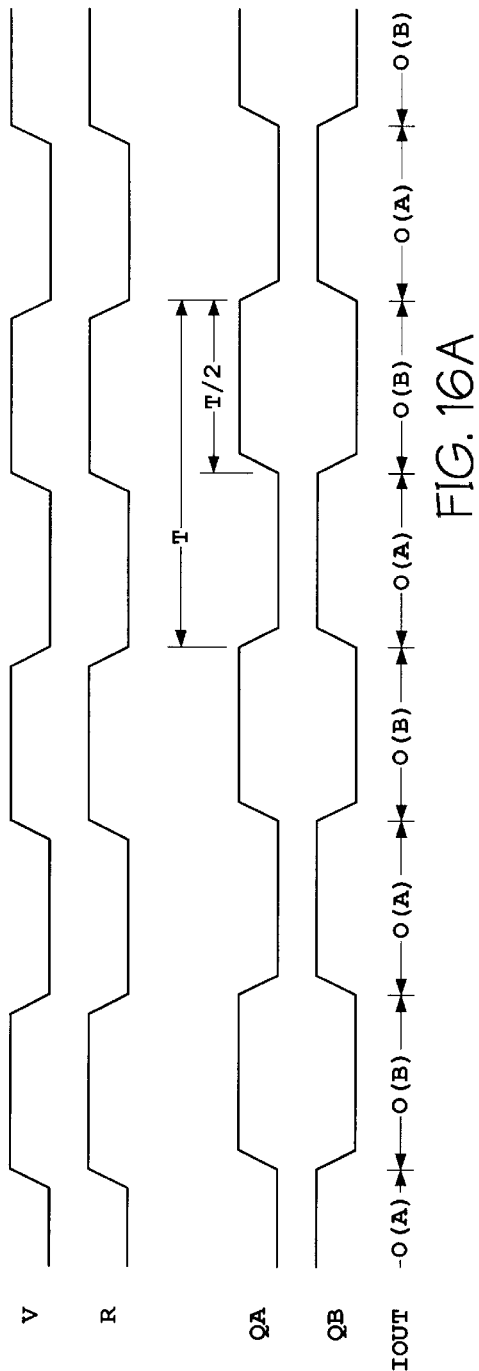
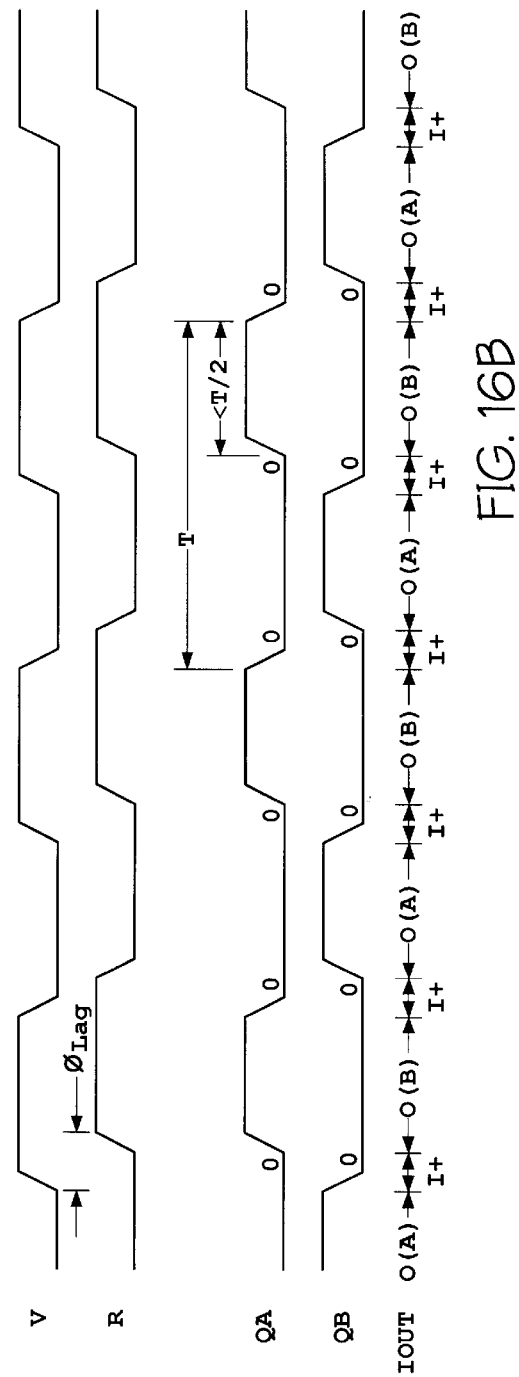
FIG. 16A
FIG. 16B

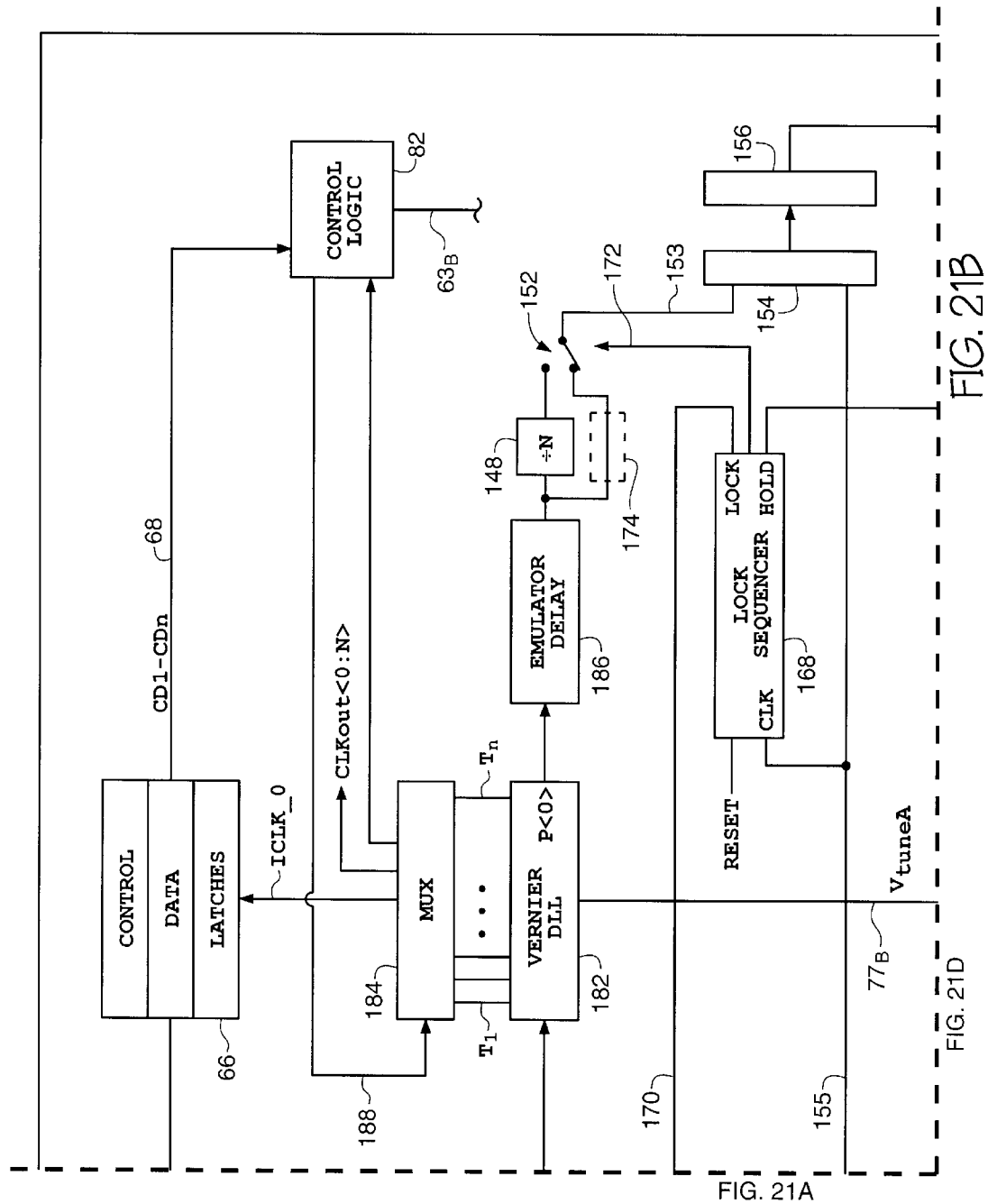

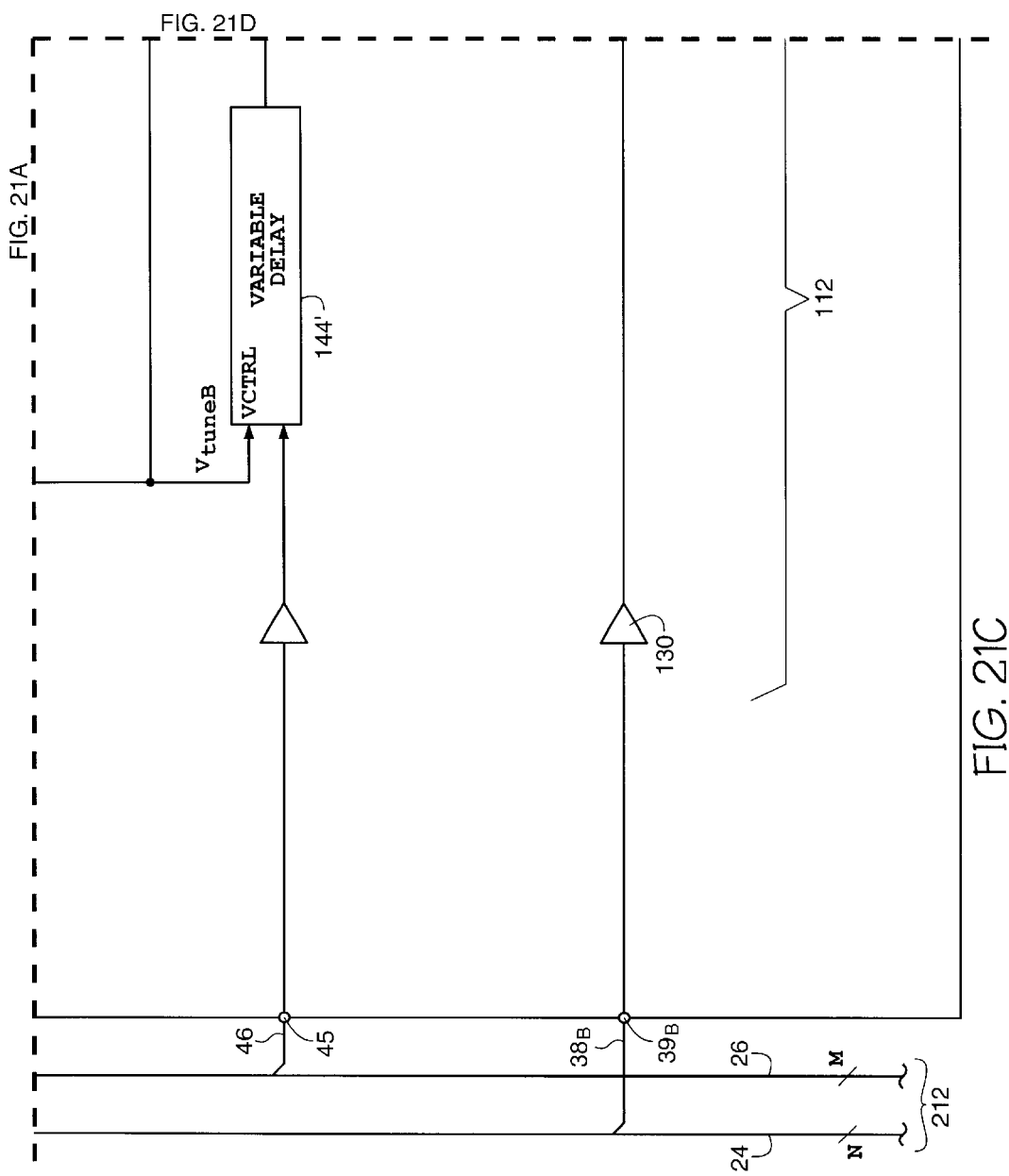

DELAY LOCK LOOP CIRCUIT USEFUL IN A SYNCHRONOUS SYSTEM AND ASSOCIATED METHODS

BACKGROUND

The present invention relates to computer systems having synchronous data transfer interfaces and also to synchronous memory devices that interface with a synchronous data bus. More particularly, the present invention relates to a delay lock loop of a synchronous memory that comprises an initialization circuit for initializing the delay lock loop to a stable and reliable operating condition.

Known prior art computer systems include processors that exchange data with a variety of memory and input/output peripheral devices. Exemplary memory devices include read only memory (ROM), dynamic random access memory (DRAM), and/or static random access memory (SRAM). Exemplary input/output peripheral devices may include a keyboard, mouse, printer or video display unit. These exemplary memory and peripheral devices typically exchange data with a processor by way of a data bus.

Synchronous dynamic random access memories (SDRAMs) employ pipelined data transfers to a processor or bus for effecting data transfer rates that are comparable to the processor's operating frequency. However, because the processor's operating frequency might be different from that of the SDRAM, a memory controller may be required between the SDRAM and the processor for accommodating their different operating speeds.

Synch-link DRAM (SLDRAM), another known type of memory, exchanges data in packet formats, wherein packets of data are sent or received, as determined in accordance with a received command packet, directly to or from a processor and in synchronous relationship thereto. Additionally, if communicating directly with a processor, the SLDRAM may not require an intermediate memory controller.

In accordance with one such exemplary prior art SLDRAM system architecture, and method of operation, a master clock propagates from a processor to a plurality of SLDRAMs to assist system synchronization, with an aim of facilitating synchronous transfer of data between the processor and memory devices. As a part of this synchronization scheme, the master clock might be used to provide the basis for the generation or correlation of signals within the SLDRAM.

With reference to FIGS. 1 and 2, an exemplary, prior art SLDRAM, hereinafter memory 10, is coupled to a bus 12. Memory 10 includes an output latch 14 and buffer 15. Data is sent from these devices to bus 12 via output terminal 21. The memory also sends a clock signal, which corresponds to that which was used to capture data within latch 14, to a terminal 23 via delay element 13 and buffer 16. The output clock signal is provided to facilitate the transfer of data across bus 12 to other devices, e.g., such as a processor. Ideally, for these signals that are output from the memory's output terminals, and referencing the waveforms of FIG. 2, transitions 32 of the data signal 28 coincide with the rising or falling edges 34 of the clock signal 30.

A synchronous relationship is also desired for a data signal and an accompanying clock signal when writing into the memory. Referencing FIGS. 3 and 4, a memory 10 is coupled to bus 12, which bus comprises N data lines 24 and M clock lines 26. Terminal 39 of memory 10 receives a data signal (e.g., waveform 43 of FIG. 4), which data signal is internally coupled to the data input of latch 33. Terminal 45 receives a clock signal (waveform 42 of FIG. 4) that is forwarded to the clock input 36 of data latch 33 by way of delay unit 35. Preferably, delay unit 35 provides an amount of delay $T_{d1}$ that appropriately positions a rising edge of the delayed clock signal 44 to a time placement $t_1$, relative the data signal, which time placement is coincident with the center of the data eye of the data signal 43 received at the data input of latch 33. However, the amount of delay that is required for optimal placement of the clock edge may change dependent upon design parameters of the data latch 33, such as its input capacitance, and any RC time constants associated with the delay circuit 35. In addition, the memory's supply voltage and its operating temperature can affect the desired optimal placement of the clock edge. Further pushing these synchronization needs, increases in computer speeds are making the processing systems less tolerable of timing changes that might be effected by voltage or temperature variations. Accordingly, delay lock loops and associated vernier circuits have been used to attempt calibration, adjustment and/or compensation of these timing changes that occur over a circuit's lifetime.

A known exemplary delay lock loop is shown as a part of memory 10 in FIG. 5. Memory 10 receives command data from data lines 24 of bus 12, at terminals 39A via command data lines 38A. Write data is received at terminal 39B via lines 38B. A system clock of clock lines 26, is received at terminal 41 by way of line 40, while the clock signal associated with the synchronous write data transfer is received at terminal 45 via line 46. The command data that is received at terminal 39A is forwarded to the data input of command latch 66 after passing through buffers 65. A command clock is presented to the latch input of command latch 66 by way of a previously programmed vernier select circuit 64. Vernier select circuit 64 comprises vernier 60 and multiplexer 62. Vernier 60 receives the command clock and provides a plurality of variously delayed representations of the command clock at the CCLK1–CCLKN outputs. Having been previously programmed in a known fashion, multiplexer 62 selects a particularly delayed representation of the clock signal for selecting an edge placement of the selected delayed clock signal that is to be substantially coincident with centers of eye patterns of the data signal received at the data input of latch 66. This delayed clock signal, which selection is routed by multiplexer 62, is forwarded as the latching clock signal to the command latch 66 for use in capturing the command data therein.

A signal from one of the outputs of vernier A, typically the output of greatest delay, e.g., CCLKN, is fed back as the variably delayed signal of the delay lock loop to variable input 70 of phase detector 72. The phase detector 72 compares the phase of the signal at variable input 70 to that of the reference signal received at reference input 74. The reference signal corresponds to the received system clock, but delayed by an amount associated with the propagation delay of buffer 73. Phase detector 72 generates an error signal at its output 75 in accordance with the detected phase difference between the variably delayed signal and the reference signal. Integrator 76 receives the error signal from phase detector 72 and generates a tune voltage (Vtune) by integrating the error signal. The tune voltage from the integrator is coupled to the control input of vernier A and is used for adjusting the amount of delay that is provided by vernier A. Upon acquiring a locked condition, the delay lock loop aims to keep the phase of the variably delayed signal at variable input 70 coincident with that of the reference clock. Thus, the delay lock loop strives to preserve the integrity of data reception by, ideally, keeping a latching edge of the selected, vernier-delayed clock signal centered within the data eye of the data signal that is received at the data input of latch 66.

When channeling command data to memory 10, the external system, e.g., a processor, supplies a continuous system clock on line 40, which runs continuously over time. On the other hand, when transferring write data that is to be written into the memory device, the clock that accompanies the write data on line 46 may be discontinuous, i.e., present only for a duration for accompanying the data transfer. Because the accompanying data clock is not continuous, a separate "slaved" vernier circuit 48 is configured for selecting optimally delayed representations of the data clock for latching data into respective registers of the receiving write data latches 33. "Slaved" vernier 48 receives the tune voltage that is generated by the continuously locked delay lock loop associated with receiving the command data. This configuration assumes, of course, that the circuitry of vernier 48 and multiplexer 52 correspond to that of vernier 60 and multiplexer 62, and that any variations with respect to voltage and temperature experienced in one will correspond substantially to that experienced by the other. Accordingly, the tune voltage adjustments generated for the one, preferably, is able to, likewise, sufficiently compensate the other for keeping the intermittent data clock appropriately positioned relative to its write data signal.

Control logic 58, as known in the art, establishes the configurations of multiplexers 52, 62 and controls operation of access circuitry 54 associated with accessing memory array 56.

To summarize, the control loop associated with the exemplary delay locked loop of FIG. 5 includes the variable input 70 of phase detector 72, integrator 76, the control input 77A of vernier A 60, and the return line to the variable input 70. It is noted, however, that for this exemplary prior art embodiment, multiplexer 62 resides outside the control loop of the delay lock loop. Accordingly, changes in the multiplexer's operating temperature or voltage might affect its propagation delay, and likewise might adversely impact the placement of the clock signal relative to the data signal.

Addressing this shortcoming of the multiplexer, and referring to FIG. 6, the prior art provided the "compound" delay lock loop. Essentially, the compound delay lock loop comprises an outer delay lock loop wrapped around an inner delay lock loop. For the exemplary compound delay lock loop of FIG. 6, the outer delay lock loop comprises phase detector 72B, integrator 76B, $V_{tuneB}$ control input 79, variable delay 98, the 180° signal path through vernier 60 (i.e., relative to the first tap Tϕ), emulator circuit 88 and the return back to the variable input 70 of phase detector 72B. The emulator circuit 88 incorporates emulating multiplexer 90 and emulating driver 92 for emulating the delay characteristics of external multiplexer 62 and driver 61 that are external the control loop of the delay lock loop. Having the emulator circuit within the control loop allows the delay lock loop to substantially compensate for deviations of the external elements (e.g., multiplexer 62 and driver 61) by way of the delay lock loop compensating the variations of surrogate emulator circuit 88.

If the delay of the emulator circuit changes, as may be effected by a voltage or temperature change, the phase detector 72B detects a phase difference between the variable signal at variable input 70 and the reference clock at the reference input 74, and an error signal to integrator 76B responsive to the detected phase difference is generated. Depending on the direction of the phase shift, integrator 76B will ramp the tune voltage $V_{tuneB}$ up or down for adjusting the delay of variable delay element 98 with an aim for compensating the change in delay of the emulator circuit. For example, if the delay through the emulator circuit 88 should increase, then the control loop of the delay lock loop will attempt to decrease the delay of the variable delay element 98 to keep the phase of the variable signal substantially coincident (or "locked") to that of the reference signal at the reference input 74. Likewise, if the delay through the emulator 88 should decrease, then the delay lock loop will increase the delay of the variable delay element 98.

Provided that emulator circuit 88 accurately emulates the external multiplexer 62 and driver 61 per their delay sensitivities with respect to voltage and temperature, then the outer loop's control of the variable delay element keeps the latching transitions of the signal at the latching input of latch 66 substantially optimally positioned, thereby substantially accommodating temperature- or voltage-effected delay variations of multiplexer 62 or buffer 61.

The inner delay locked loop, further referencing FIG. 6, comprises multi-tap vernier 60, phase detector 72A and feedback circuit 76A. The feedback circuit has its output coupled to the control input 77A of vernier 60 and provides the tune voltage $V_{tuneA}$ for controlling the vernier's delay. When locked, the inner delay lock loop maintains the relative phase relationships of the variously delayed signals of the vernier's output taps, with an aim of accommodating any temperature or voltage changes that might otherwise affect vernier 60. More particularly, the inner delay lock loop ideally provides a control signal $V_{tuneA}$ to the control input 77A of vernier 60 for maintaining a 180° phase difference between the signals of the vernier's first and last output taps.

In operation, referencing the timing diagrams of FIG. 7, a system clock (CMDCLK) passes through buffer 73 (of FIG. 6) to provide signal A. Variable delay element 98 provides signal B with a delay determined in accordance with the value of the outer loop's control signal $V_{tuneB}$. Vernier 60 receives signal B and outputs progressively delayed representations C, D, etc., of signal B at taps T0, T1 . . . T15. The incremental delay between the output taps may be, in general, equal to the vernier's total delay divided by the number of taps. The inner delay lock loop controls the delay of vernier 60 by providing a value for control signal $V_{tuneA}$ for maintaining a 180° phase difference between signals C and D of the first and last taps.

As determined by the configuration signals 63, multiplexer 62 selects desired output taps of vernier 60 from which to source different internal signals of the memory. For example, the configuration signal Y1SEL<0:3> for a first channel configures the multiplexer to select a particular one of the 16 taps from which to source the command clock signal E for driving the latch input of command latch 66. Likewise, the configuration signal Y2SEL<0:3> determines the tap from which to source another clock signal F. Known calibration procedures obtain values for the configuration signals, which are determined to obtain the optimally delayed representations of the system clock for their respective application. For the application associated with the command clock signal E, the calibrated value for configuration signal Y1SEL<0:3> obtains an optimally delayed representation of the system clock for placing a rising edge of the derived signal E centered within (relative to) a data eye of the data signal H as received by latch 66. Similarly as discussed relative to FIG. 5, command data buffer 65 and command clock buffer 73 are designed similarly to provide similar propagation delays with similar temperature or voltage sensitivity characteristics, as portrayed by the waveforms A and H relative to CMDCLK and CMDDATA.

Further referencing FIG. 6, and as already noted, the compound delay locked loop provides the command clock for latching command data into latch 66. Emulator circuitry 88 simulates multiplexer 62 and clock driver 61 so that the outer delay lock loop can adjust the delay of the variable delay element 98 for accommodating the delay deviations of the emulated external elements to present an optimal timing relationship of the command clock signal relative to the data signal received by latch 66. In other applications, such as, for example, writing data from the memory to a bus or receiving data to be written within the memory, the delay lock loop may need to accommodate delay changes effected by voltage or temperature sensitivity characteristics of, e.g., an output driver, edge shaper, or other signal conditioning circuit. However, with the prior art delay lock loops discussed herein, the emulator circuit for emulating the multiplexer, driver, shaper and/or other conditioning circuits, because of temperature or voltage variations, may accumulate, a delay shift magnitude that exceeds an adjustment limit of variable delay element 98. This is especially true if the delay lock loop was initialized with the variable delay element set near its lower limit. Accordingly, the memory's data transfer integrity can be compromised.

To better appreciate the problems of the prior art, one should note that a delay lock loop can lock with a delay that is an integral number of clock cycles long, i.e., the delay may be 1, 2, 3, or more cycles of the input frequency. Referring to FIG. 6, the problem to be solved arises when the delay between nodes B and G is slightly less than an integral number of clock cycles. The loop may lock with the delay of variable delay element 98 near the minimum of its range. If the temperature or supply voltage causes the delay of emulator circuit 88 to increase, variable delay 98 will then be unable to decrease, causing the loop to unlock. One solution to this problem is to run the loop at a submultiple of the clock frequency by inserting a frequency divider directly following buffer 73, and choosing the divisor such that the delay between nodes B and G is substantially less than one cycle of the divided clock. However, even with a frequency divider, a problem can also occur if the loop locks with the delay of variable delay 98 near the maximum of its range. A decrease in the delay of emulator circuit 88 will again cause the loop to unlock.

Accordingly, there exists a need to assure the integrity of data transfer for synchronous data networks and its associated synchronous memory. Additionally, there exists a need to improve the reliability and initialization of delay locked loops of such synchronous memory. The present invention recognizes these needs and proposes solutions thereto.

SUMMARY OF THE INVENTION

A method and circuitry for a delay lock loop useful in synchronizing the accessing of a memory array with a system clock is disclosed. In a preferred embodiment, the delay lock loop includes a variable delay element. The delay of the variable delay element is initially set to a minimum delay value. The system clock is then frequency divided and sent to the variable delay element, the output of which will ultimately be used to access the memory array in a synchronized manner with the system clock. The frequency divided clock and the output of the variable delay element are input to a phase detector, which creates a control signal for adjusting the delay of the variable delay element. After the signals are determined to be locked by the phase detector, an undivided clock signal version of the clock signal is sent to the variable delay element, and a frequency divided version of the output of the variable delay element is sent to the phase detector in lieu of the previous output of the variable delay element.

BRIEF DESCRIPTION OF THE DRAWINGS

The present invention will be understood from reading descriptions of particular embodiments with reference to specific embodiments illustrated in the appended drawings. These drawings depict only exemplary embodiments of the invention and are not therefore to be considered limiting of its scope.

FIGS. 9A–9B provide a simplified block diagram of a compound delay lock loop of another exemplary embodiment of the present invention.

FIG. 16A is a timing diagram characterizing operation of the phase detector and charge pump of FIG. 14 when the variable and reference clock signals are coincident with one another.

FIG. 16B is a timing diagram characterizing operation of the phase detector and charge pump of FIG. 14 when the phase of the variable signal leads that of the reference clock.

DETAILED DESCRIPTION OF THE PREFERRED EMBODIMENTS

The present invention generally relates to synchronous memories and to delay lock loops for such synchronous memories that incorporate initialization circuitry for initializing a delay lock loop within a stable and reliable configuration.

Figure 6:
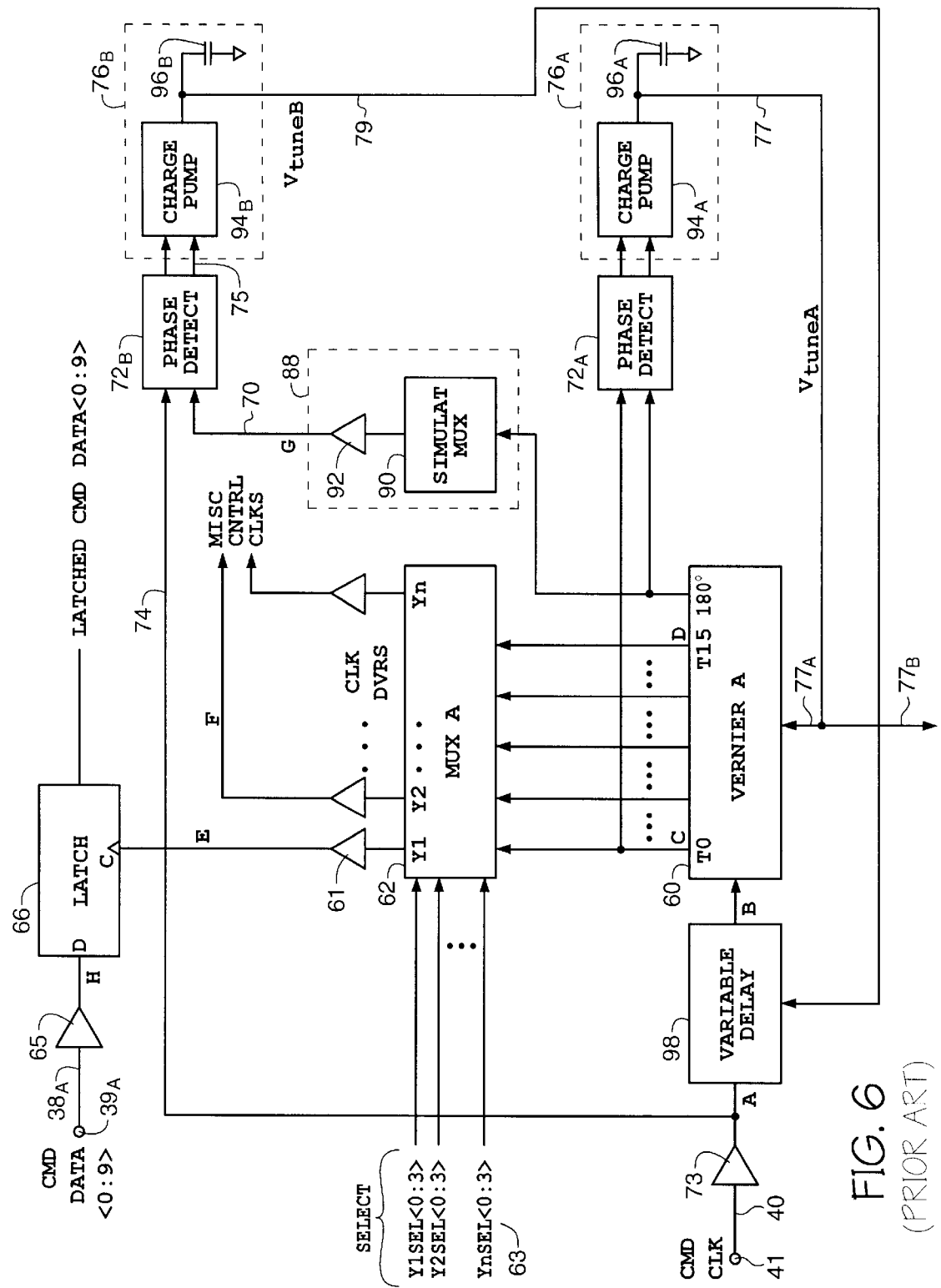
FIG. 6 is a schematic diagram representative of a prior art compound delay lock loop.
Figure 7:
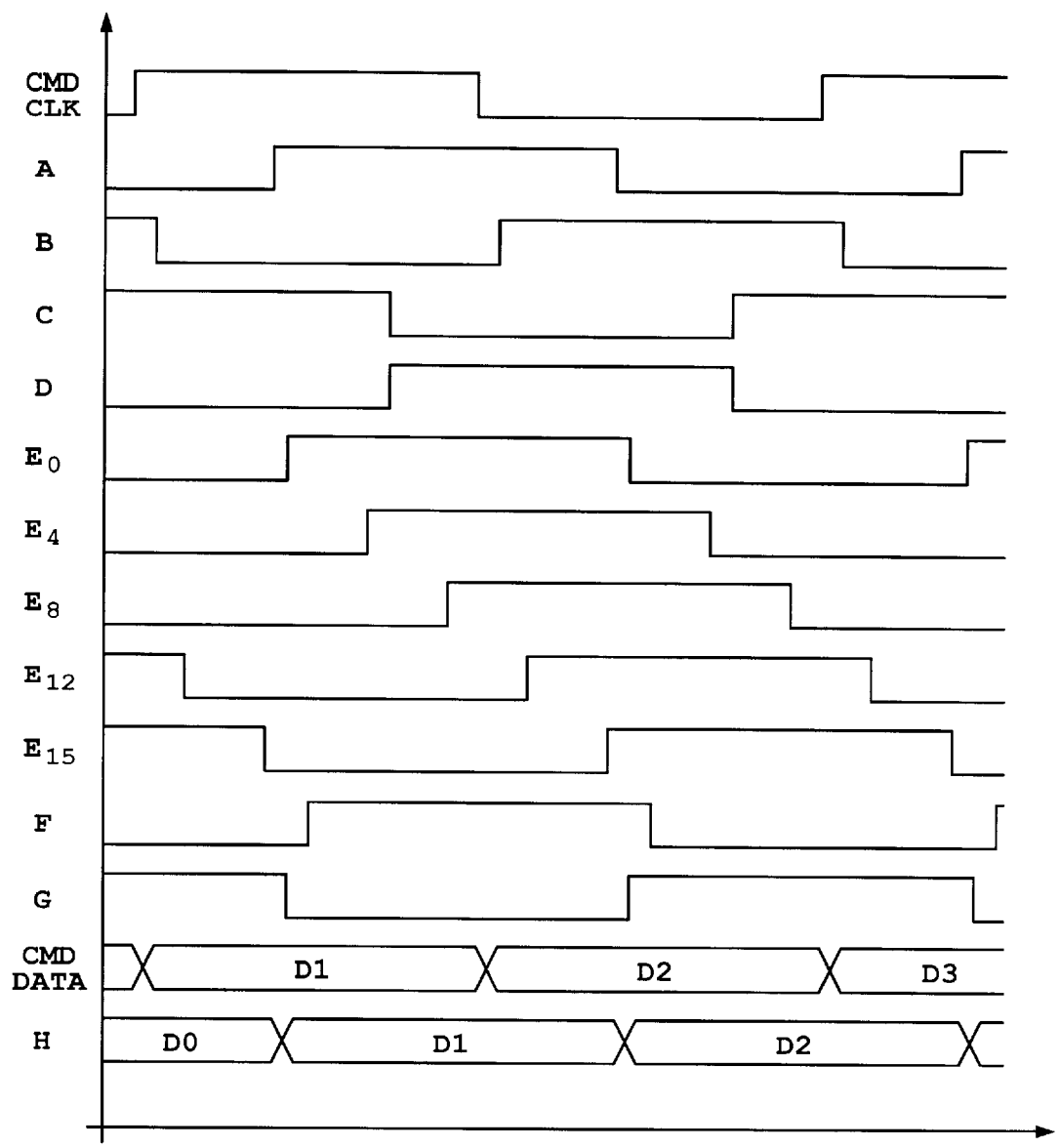
FIG. 7 is a timing diagram of various signals during operation of the circuit of FIG. 6.

To briefly summarize the disclosed solution to the problems presented by the prior art, and referring again to FIG. 6, the delay lock loop is initialized with the delay of variable delay 98 at its minimum, while also incorporating circuitry that assures that the delay of 98 slews in a positive direction until the loop locks. As will be seen, frequency dividers are useful in achieving this result. However, the disclosed solution requires that the desired frequency at the variable input 70 of phase detector 72B is the divided clock, while the desired frequency from clock drivers 61 and simulated clock driver 92 is the undivided clock. Accordingly, the loop is initialized with the divider for the variable path positioned ahead of variable delay 98, and then after the loop is stabilized, the location of the divider is switched such that it is inserted between simulated clock driver 92 and variable input 70 of the phase detector 72B. The divider between buffer 73 and reference input 74 of phase detector 72B remains fixed. The details of the solution follow.

Figure 8:
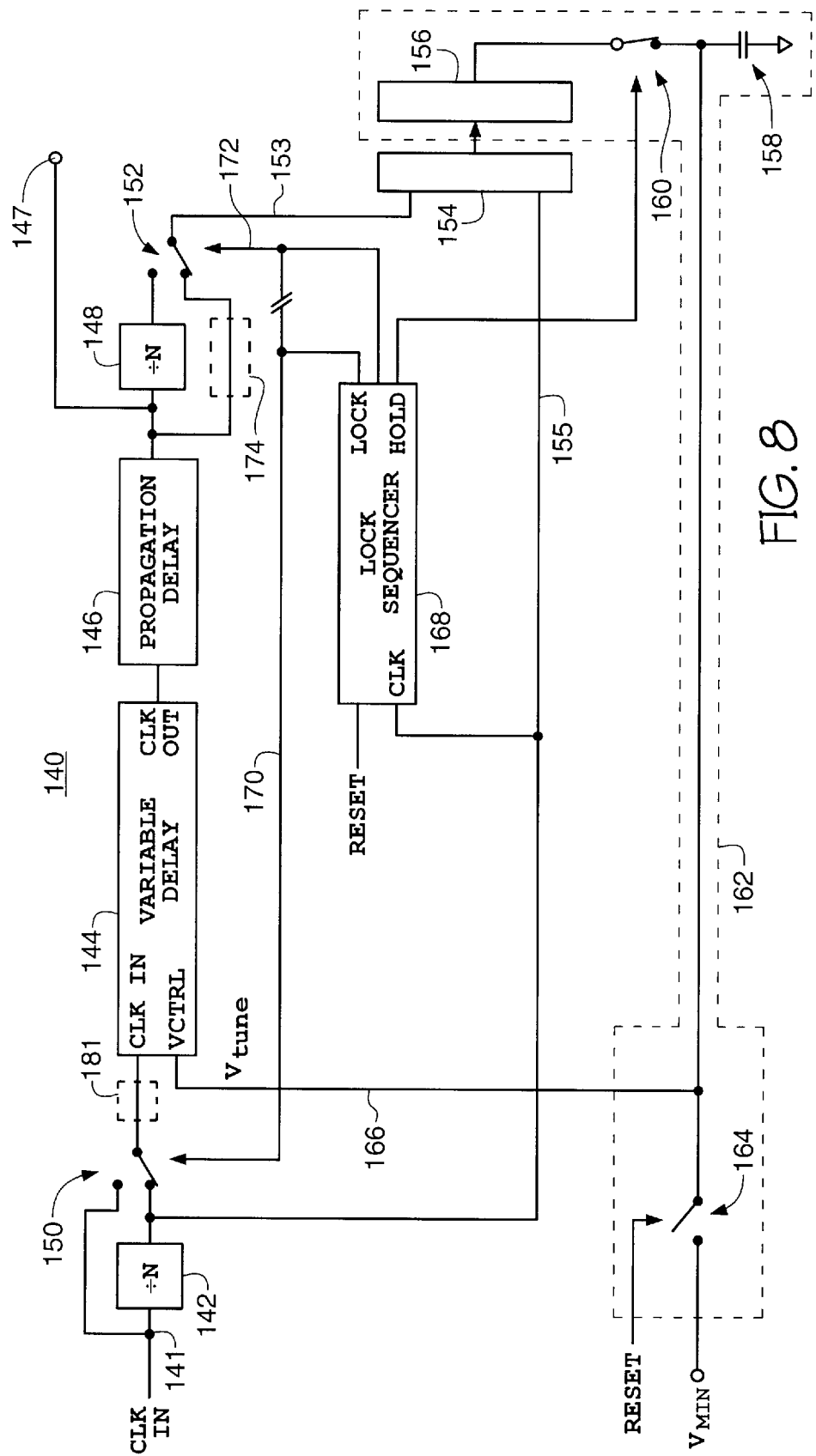
FIG. 8 is a simplified block diagram of a delay lock loop with initialization circuitry in accordance with an exemplary embodiment of the present invention.

Referencing FIG. 8, a delay lock loop 140 in accordance with an exemplary embodiment of the present invention comprises a clock input 141 coupled to frequency divider 142 and also to a first terminal of switch 150. The output of divider 142 is coupled to the second terminal of switch 150. Switch 150 selectively couples variable delay element 144 to receive either the divided clock signal via divider 142, or the undivided clock signal directly from input 141. Control line 170 provides a control signal to switch 150 to determine its configuration. The variable delay element 144 provides a propagation delay that is determined in accordance with the value of a control signal $V_{tune}$ that is received at its control input 166. In accordance with an exemplary embodiment of the present invention, variable delay element comprises an adjustable propagation delay between minimum and maximum nanoseconds, which may vary upon the application at hand and the clock speed.

An optional aspect of the preferred embodiment comprises a duty cycle compensator 181 disposed in the signal path between switch 150 and variable delay element 144. The duty cycle compensator 181 will condition an asymmetric input signal, for example, one having a longer high duration versus the low duration to provide a symmetrical output signal of the same frequency. U.S. patent application Ser. No. 09/654,226 filed Aug. 30, 2000, assigned to the assignee of the present application, and hereby incorporated by reference in its entirety, discloses exemplary embodiments and operation of such a duty cycle compensator 181.

The output of divider 142 is also coupled to the reference input 155 of phase detector 154. This signal path to the phase detector 154 does not require a duty cycle compensator because this is unnecessary given the operating principles of divider 142. This is because the divider 142 acts upon either the rising or falling transitions of the signal at its input. Accordingly, and assuming a periodic input signal, the resulting divided output signal is symmetric.

Returning to the signal path associated with the variable delay, the output of variable delay element 144 is coupled to the input of delay block 146. As is well known in the art, delay block 146 includes circuits for conditioning the clock signal prior its presentation at destination terminal 147. Exemplary conditioning circuits include an output buffer, a shaping or sharpening circuit, and/or other circuits for providing sufficient output current or sharpness for the output signal to drive one or more latch inputs within the memory. For example, the output clock signal may need sufficient sharpness and current for driving a long signal line within the memory device, or, alternatively, for driving a signal line to accompany a synchronous data transmission external to the memory. Regardless of the specific application, such conditioning circuits of delay block 146 will delay the clock signal before reaching destination 147.

With the conditioning circuits within the control loop of the delay lock loop, delay lock loop 140 is able to control the timing relationship of the clock signal presented to destination 147 such that the output clock is substantially synchronous and coincident with the reference signal at the reference input 155 of phase detector 154. For an alternative configuration that incorporates delay unit 174, the output clock is made synchronous and coincident to the clock at input 141. These operating principals of the delay lock loop will become more apparent as further details are explained below.

Further referencing FIG. 8, second divider 148 receives and frequency divides the output signal of delay 146 to provide a divided output signal to a first select terminal of switch 152. The second select terminal of switch 152 receives the undivided signal directly from delay 146, by way of an alternative path that bypasses divider 148. In accordance with an alternative aspect of this embodiment, an optional delay unit 174 is serially disposed within the bypass path and provides a delay comparable to that of divider 148. This assures that transitions of the clock signal as presented to the second select terminal of switch 152 are substantially coincident with the output transitions as would otherwise be provided by divider 148. This coincident timing configuration allows system transients or jitter during operation of delay lock loop 140 to be minimized when switch 152 is switched from a first position to its second position.

The output terminal of the switch 152 is coupled to the variable input 153 of phase detector 154. The variable input 153 of phase detector 154 is termed "variable" because of its association with variable delay element 144. The reference input 155 of phase detector 154 is electrically coupled to receive a signal from the output of first divider 142. When the delay lock loop is locked and stabilized, the phase of the signal arriving at the variable input 153 corresponds to that of the signal arriving at reference input 155. Therefore, if temperature or voltage variations change the delay of block 146, phase detector 154 will determine a phase difference and provide an error signal responsive to the determined phase difference. Assuming that switch 160 is closed, integrating capacitor 158 accumulates charge from charge pump 156 for providing control signal $V_{tune}$. As a result, the control signal $V_{tune}$ will ramp up or down, depending upon the determined phase error, for adjusting the delay of variable delay element 144 for absorbing the delay fluctuation of delay block 146. As a result, clock transitions at destination 147 are kept coincident with transitions of the reference clock input 141.

In normal operation, the first switch 150 of the delay lock loop 140 couples the clock input directly to the variable delay element 144, while the second switch 152 couples the second divider 148 to the variable input 153 of phase detector 154. Switch 160 is closed for coupling the charge pump to integrating capacitor 158, and switch 164 opened for disconnecting the control input 166 from the clamp voltage $V_{min}$. Ideally, variable delay element 144 establishes a propagation delay sufficient for synchronizing a rising edge of a clock transition at the variable input 153 to a transition of the clock received at the reference input 155. Accordingly, should delay block 146 experience an increase in propagation delay, for example, due to temperature or voltage changes, then the delay lock loop 140 will adjust the control signal $V_{tune}$ for decreasing the delay of delay element 144 to accommodate the delay increase experienced by delay block 146. However, if the variable delay element 144 is already at the lower end of its adjustable range, then an increase in delay of delay block 146 will cause the delay lock loop to lose lock given that a further decrease in the delay of variable delay element 144 is not available.

Recognizing these limitations, the circuits and methods disclosed herein provide a variable delay element 144 of a delay lock loop with the ability to be set to an initialized tune position of reliable operation.

Figure 11:
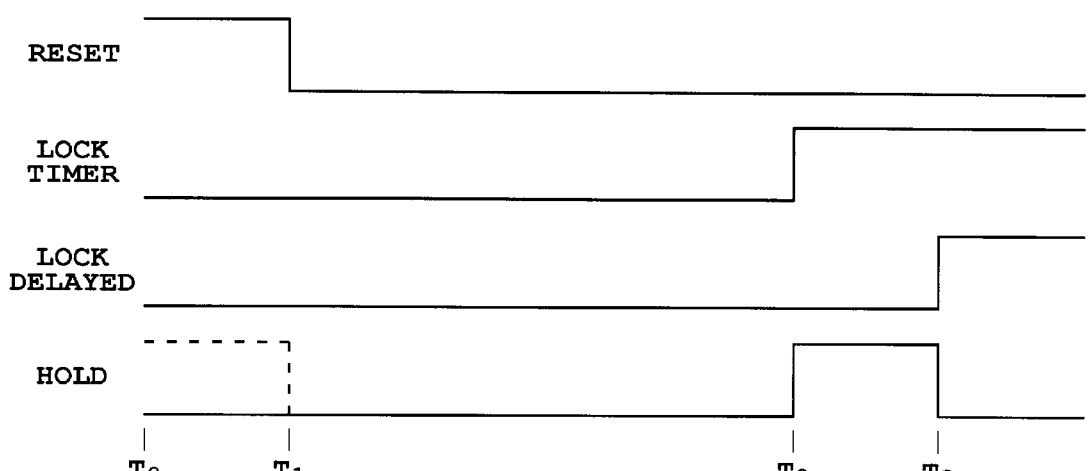
FIG. 11 is a timing diagram showing a sequence of signals during operation of a delay lock loop of an exemplary embodiment of the present invention.

For an exemplary initialization sequence, and referring to FIGS. 8 and 11, lock sequencer 168 sends control signal 170 for configuring first switch 150 to couple the input of variable delay element 144 to the output of divider 142, and a second control signal 172 for configuring second switch 152 to couple the variable input 153 of the phase detector 154 to receive the signal from delay block 146. Lock sequencer 168 provides a third control signal that holds switch 160 closed for coupling the output of charge pump 156 to capacitor 158.

Additionally, the divided clock signal of divider 142, can be used to drive a timer (or counter) within the lock sequencer for advancing the initialization sequence of the delay lock loop. Alternatively, lock sequencer 168 receives the clock signal directly from input 141.

Pursuant to the initialization sequence, at a time $T_0$, a reset signal is high and switch 164 closed for coupling control terminal 166 of variable delay element 144 to the $V_{min}$ clamping voltage. The level of $V_{min}$ is selected for setting the variable delay element 144 to its minimum settable delay. Subsequently, at time T1, the reset signal transitions low for disconnecting the control terminal 166 from the clamping voltage $V_{min}$. At this time, phase detector 154, charge pump 156, and capacitor 158 generate control signal $V_{tune}$ to increase the delay of variable delay element 144. The tune signal continues to ramp until transitions of the variable signal at variable input 153 move into synchronization with transitions of the reference signal at reference input 155.

With divider 142 within the control loop of the delay lock loop during initialization, the delay lock loop will acquire lock upon the variable delay element slipping the variable signal 153 by a delay sufficient to correlate transitions of that signal to transitions of the reference signal 155. For example, assuming a clock input of 500 MHz, and assuming that divider 142 divides the CLKIN signal by four, the delay of variable delay element 144, when added to the propagation delay of 146, preferably provides a delay of 8 ns, i.e., four times the clock period of 2 ns, whereupon transitions of the variable signal 153 will coincide with transitions of the reference signal 155.

At time $T_2$, the first switch 150 is configured to channel the input CLKIN signal directly to the variable delay element 144. In addition, lock sequencer 168 opens switch 160 to temporarily disconnect capacitor 158 from charge pump 156. Switch 160 is temporarily opened to prevent any control loop transients resulting from noise of delay lock loop reconfiguration from impacting stable control of variable delay element 144.

At time $T_3$, lock sequencer 168 re-configures switch 152 to couple the output of second divider 148 to the variable input 153 of phase detector 154. Preferably, during the hold time between times $T_3$ and $T_2$, the input clock signal will have propagated through variable delay element 144, delay block 146, and divider 148. Next, the lock sequencer closes switch 160 to couple the output of charge pump 156 to integrating capacitor 158. Using this initialization sequence, variable delay element 144 is initialized to a mid-region of its adjustable tune range so that the delay lock loop may reliably operate within the adjustment range of variable delay element 144 for accommodating delay increases increases or fluctuations of delay block 156.

Variable delay element 144 is initialized to a setting that is above its minimum settable delay by an amount greater than the anticipated variation of delay block 146 over its anticipated ambient operating conditions. Accordingly, the divisor N of first divider 142 is selected with a magnitude to assure that N cycles of the input clock ($N*T_{clock}$) is greater than the anticipated total delay of delay block 146 over its anticipated ambient operating conditions.

In accordance with an alternative embodiment, further referencing FIG. 8, a direct electrical coupling is provided between the output of delay block 146 and the variable input 153 of phase detector 154. During operation of the delay lock loop, phase detector 154 compares the variable signal at input 153 to the reference signal at reference input 155. Although, the frequency of the variable signal is greater than that of the reference signal, meaningful phase errors can be determined by comparing each transition of the reference signal to every, for example, $4^{th}$, $5^{th}$, $6^{th}$, etc., transition of the variable signals, depending upon their harmonic relationship as determined by divisor N. For this alternative embodiment, to assure that transitions of the signal at output 147 are coincident with those at input 141, optional delay unit 174 can be disposed between the destination output 147 and the variable input 143 of phase detector 154 to provide a delay equal to that of first divider 142.

The feedback circuit 162 of the delay lock loop pursuant to the embodiment disclosed in FIG. 8 comprises charge pump 156, switch 160, accumulation capacitor 158 and reset switch 164. However, it is understood that alternative exemplary embodiments of feedback circuit 162 may be comprised of other circuits that are able to effectively integrate the error signal responsive to the detected phase differences of phase detector 154, hold the generated tune signal $V_{tune}$ responsive to the hold signal of sequencer 168, and clear the integrated value of the generated tune signal $V_{tune}$ responsive to a reset signal.

Thus far, the delay lock loop has been described as accommodating delay variations of drivers or shaping circuits to provide a clock signal at an output that is coincident with an input signal. It is further noted that for the particular exemplary embodiment depicted in FIG. 8, it was assumed that the clock signal ran continuously and that it was always available to the delay lock loop.

In accordance with alternative embodiments of the present invention, a compound delay lock loop architecture 180 is provided to address synchronous data transfer applications in situations where a plurality of clock signals is required, each of said clock signals having selectable timing relative to the others. For example, with reference to FIGS. 9A and 9B, a clock signal at input 141 is applied to divider 142 and a first terminal of switch 150. The divider output is coupled to the second terminal of switch 150 and also to the reference input 155 of phase detector 154. The output of switch 150 feeds variable delay element 144, preferably, but optionally, via duty cycle compensator 181. Inner vernier delay lock loop 182 receives the output of variable delay element 144 and provides a plurality of variously delayed representations of the received signal at its plurality of output taps $T_0$ through $T_n$. Multiplexer 184 selects, per control select signals applied thereto, optimal phase representations of the clock signal for use with the associated clocking applications. Further description of inner vernier delay lock loop 182 and multiplexer 184 and their operation may be found in U.S. patent application Ser. No. 08/879,845 filed Jun. 20, 1997, assigned to the assignee of the present application, and hereby incorporated by reference in its entirety.

One output, for example, the first output, of vernier delay lock loop 182 is coupled to emulator circuit 186. Emulator circuit 186 provides a propagation delay that corresponds to circuitry of multiplexer 184, and/or associated buffers, switching elements, shaping circuits and other conditioning circuits. The output of emulator circuit 186 is routed to the variable input 153 of phase detector 154 via divider 148 or delay unit 174, as determined in accordance with the configuration of switch 152.

As before, phase detector 154 provides an error signal responsive to a phase difference determined between the variable signal at the variable input 153 and the reference signal at the reference input 155. Charge pump 156 and capacitor 158 integrate the error signal. Capacitor 158 accumulates the charge provided by charge pump 156 to provide the control signal $V_{tune}$. Lock sequencer 168 is operative to advance the delay lock loop through various configurations of an initialization sequence so as to initialize the delay lock loop 180 with the variable delay element 144 set to a mid-range of its adjustable range.

Figure 9A:
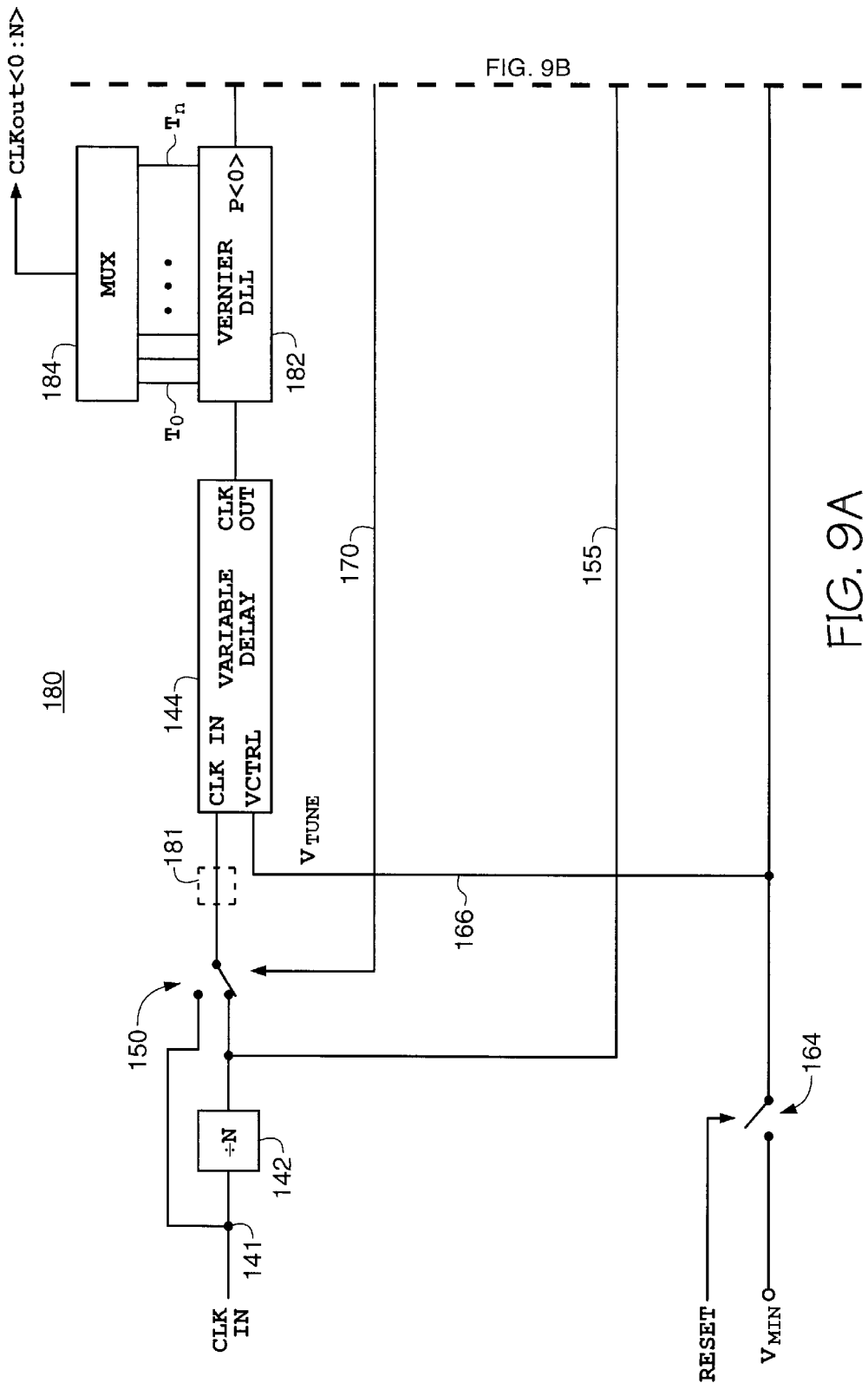

For example, at start up, and with reference to FIGS. 9A, 9B and 11, lock sequencer 168 configures first switch 150 for coupling the input of variable delay element 144 to receive the divided output signal of divider 142, while the second switch 152 is configured for coupling the output of emulator circuit 186 to the variable input 153 of phase detector 154. At time $T_1$, reset switch 164 is disabled so that capacitor 158 is allowed to accumulate charge as provided by charge pump 156. Charge pump 156 begins ramping the control signal $V_{tune}$ to increase the delay of variable delay element 144. As this occurs, eventually, transitions of the variable signal at the variable input 153 of phase detector 154 will coincide with those of the reference signal at reference input 155. This ramping duration is affected by the value of the divider 142's divisor N. Similarly, and as discussed with respect to FIG. 8, the divisor value is selected such that the product of N cycles of the input clock, i.e., $N*T_{clock}$ will be greater than the anticipated delay variation extent of emulator circuit 186.

At time $T_2$, lock sequencer 168 changes the first control signal to configure switch 150 to channel the clock input signal 141 to the input of variable delay element 144, which signal path preferably includes optional duty cycle compensator 181. Next, at time $T_3$, the lock sequencer reconfigures switch 152 for coupling the output of the second divider 148 to the variable input 153 of phase detector 154. In accordance with an alternative aspect of this embodiment, a delay unit 174 is provided between emulator circuit 186 and phase detector 154, and whose function was explained earlier.

During the interval of time between the reconfiguration of the first and second switches 150, 152, i.e., between times $T_2$ and $T_3$ respectively, switch 160 is preferably disabled to hold the value of the control signal $V_{tune}$, allowing the undivided clock to propagate through variable delay element 144, vernier DLL 182, emulator circuit 186, and divider 148 of the delay lock loop before returning switch 160 to its closed position. This prevents the loop from being disturbed by the two different frequencies that are transiently present at the inputs of phase detector 154 during reconfiguration of the delay locked loop.

Figure 10A:
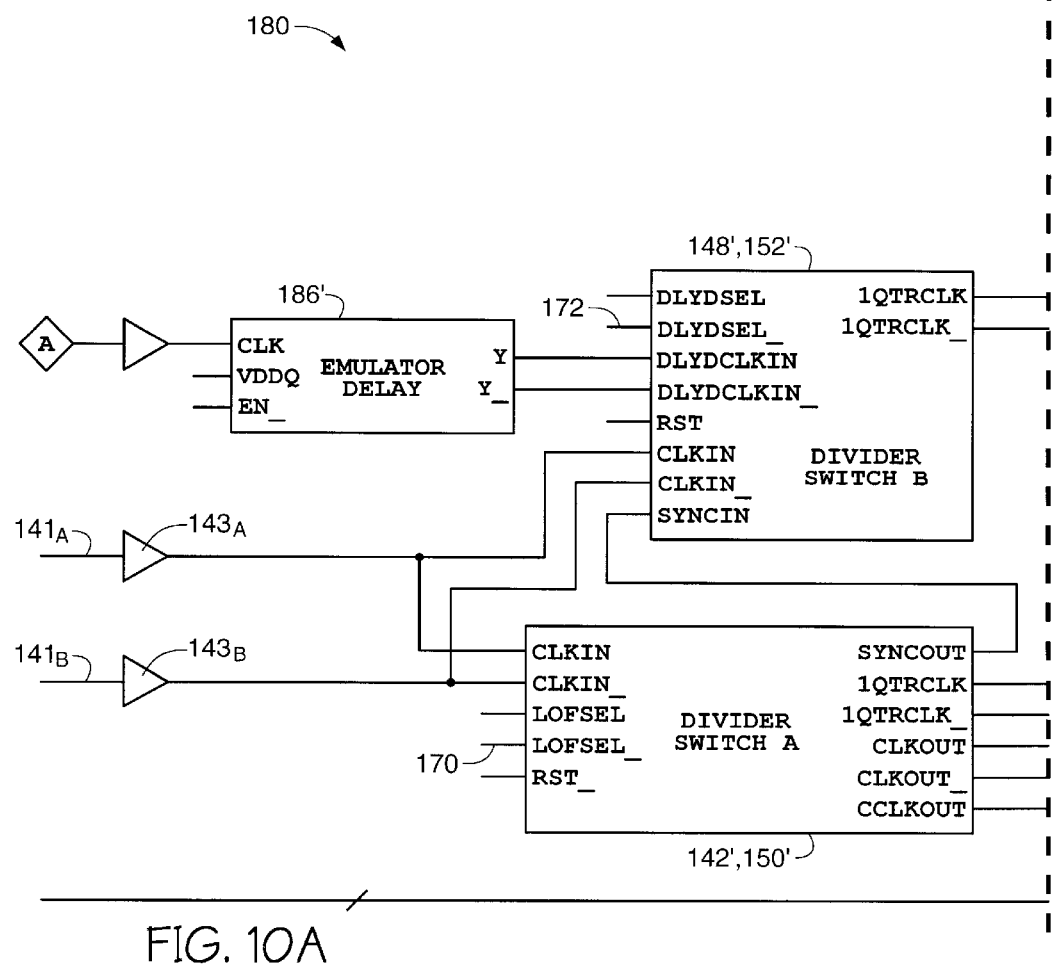
FIG. 10 consisting of FIGS. 10A–10C is a more detailed schematic diagram for a particular exemplary embodiment of the compound delay lock loop of FIGS. 9A–9B.
Figure 10B:
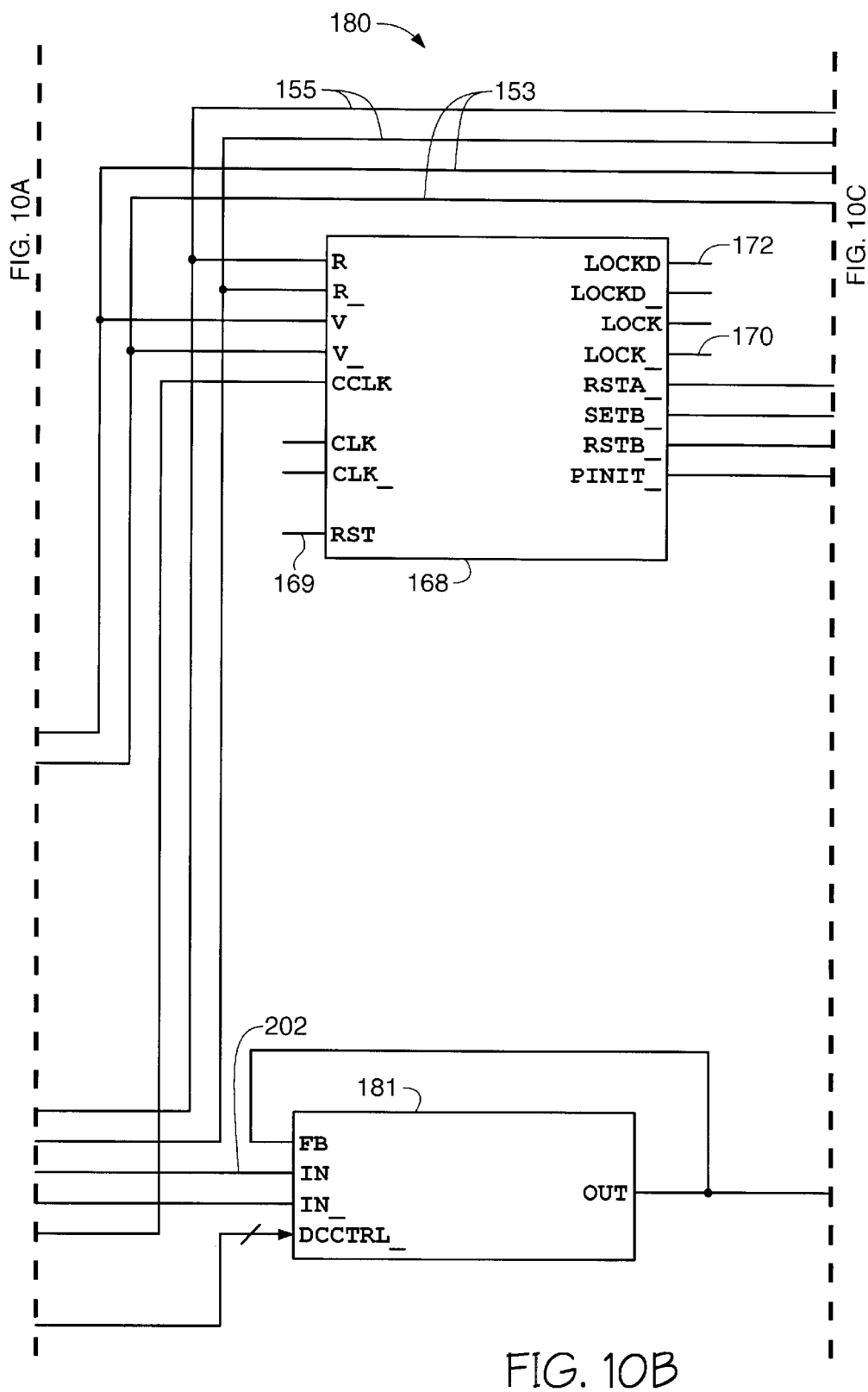
Figure 10C:
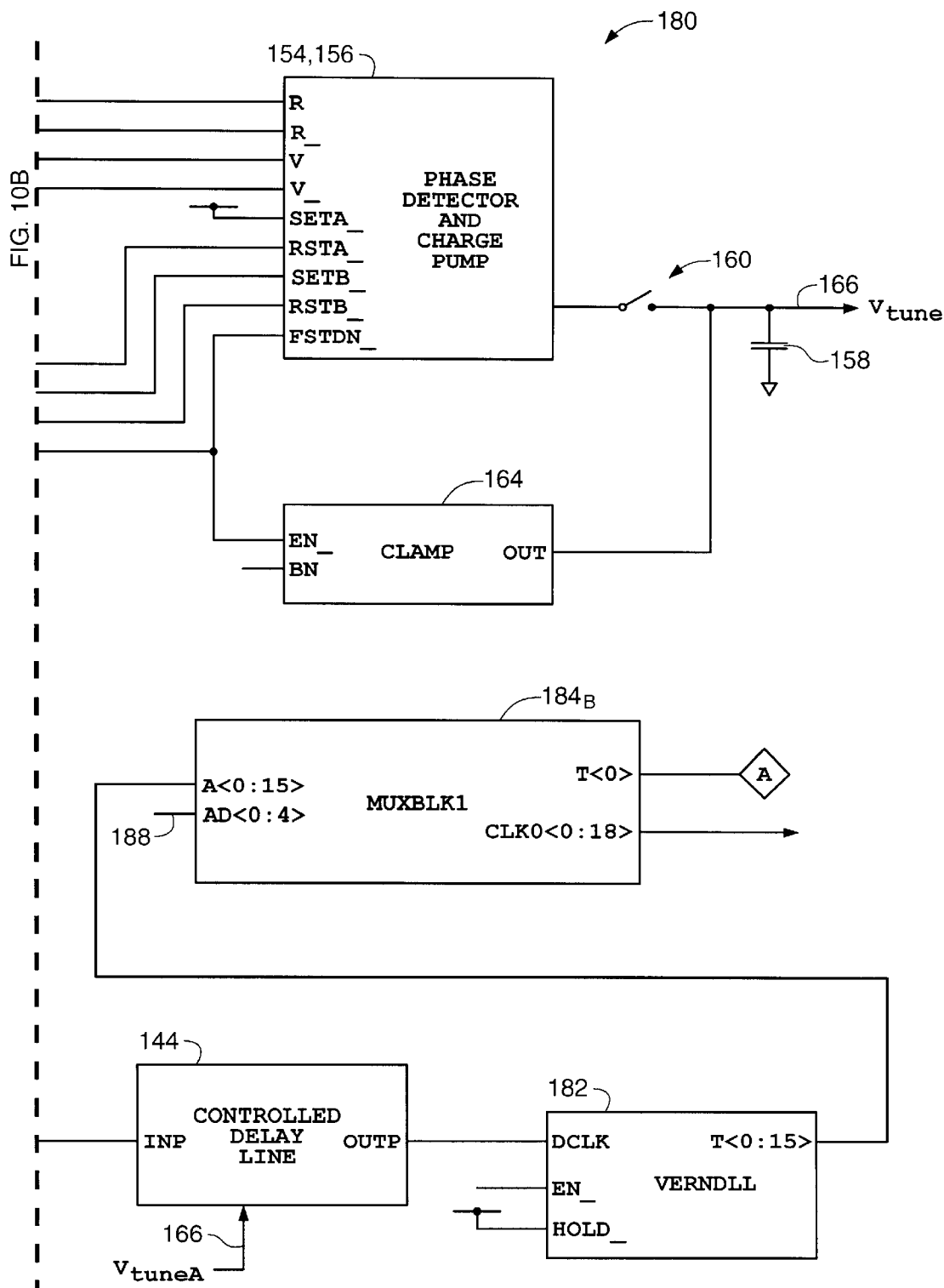
Figure 12:
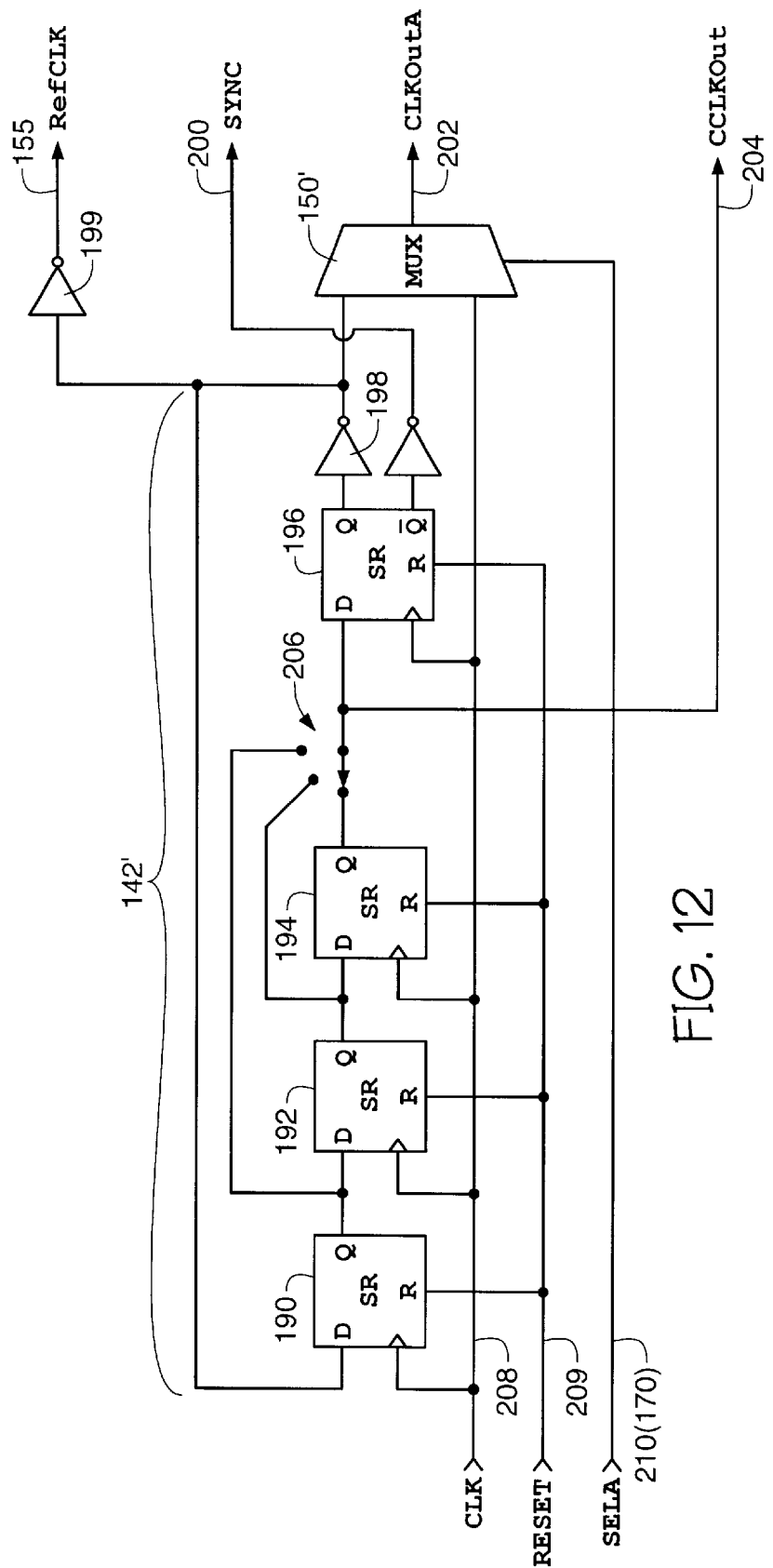
FIG. 12 is a schematic diagram of an exemplary divider and a multiplexer for the circuit A of FIG. 10.

A more detailed description of an exemplary compound delay lock loop is provided with reference to FIG. 10. Delay lock loop 180 receives an input clock ClkIn at input 141. Buffer 143 passes the clock to the respective clock inputs of divider-switch-A (142', 150') and divider-switch-B (148', 152'). (For-purposes of simplifying the present description, it will be understood that reference to a signal may be directed to both its primary and complementary parts. For example, "clock input" 141 is meant to encompass both its primary input 141A and its complementary input 141B, which are associated with the respective primary and complementary clock signals ClkIn and ClkIn_.) Divider-switch-A (142', 150') which comprises division circuitry 142' and multiplexer 150', is shown in further detail in FIG. 12. The division circuitry comprises a plurality of D flip-flops serially arranged such that the Q outputs of flip-flops 190, 192, 194 feed the D inputs of the subsequent flip-flops 192, 194, 196 respectively. These serially configured D flip-flops each have their clock inputs tied to receive clock signal Clk from the clock input terminal 208. The Q output of flip-flop 196 is inverted by inverter 198 and is fed back as the D input to flip-flop 190, in what is known in the art as a "Johnson counter." A selectively configurable switch 206 establishes a programmable divisor value of divider 142'. With the switch 206 configured in its lowest select position, as shown in FIG. 12, the output of flip-flop 194 would be coupled to the D-input of flip-flop 196 to provide the divider 142' a divisor value of 8. When switch 206 is configured to select the middle select terminal, the output of flip-flop 192 feeds the D-input of flip-flop 196 to provide a divisor of 6. Finally, if switch 206 is configured to select the upper select terminal, the output of flip-flop 190 is coupled to the input of flip-flop 196 and provides a divisor of 4.

Continuing with reference to FIG. 12, the reset input 209 allows the divider 142' to be cleared, thereby configuring all flip-flops to a zero state, output condition. The select line 210, corresponding to the control line 170 of FIGS. 8, 9A, and 9B, allows a controller, e.g. a lock sequencer, to configure multiplexer 150 to select one of either the clock signal or the divided clock signal for output 202, CLKOutA. The output of inverter 198 is passed through inverter 199 to form RefCLK 155, the reference input to phase detector 154. Another buffered output 200 of the first divider 142 provides a signal to the second divider-switch-B (148', 152') for selective use, as will be described more fully subsequently herein, to keep the second divider of the DLL in a known state relative to that of the first divider. The output of selector 206 is coupled to 204, CCLKOut, to provide the appropriate phase of the frequency-divided clock to the counter in the lock sequencer.

Returning to FIG. 10, the primary output 202 of first divider switch (142', 150') is fed to variable delay element 144, preferably, by way of duty cycle compensator 181. Duty cycle compensator 181 conditions the signal to assure a 50/50 duty cycle or symmetry for its output signal. However, if the input signal is known to have sufficient symmetry, the duty cycle compensator can be omitted.

Variable delay element 144 provides a propagation delay therethrough that is established in accordance with the value of the control signal $V_{tune}$, which is received at its control input 166. The delayed signal that is output from variable delay element 144 is coupled to inner vernier DLL 182. Inner vernier DLL 180 provides a plurality of variously delayed output signals at respective plurality of output taps T<0:15>. The plurality of output taps T<0:15> are coupled to multiplexer 184. Multiplexer 184 selects, as determined by the select and control signals 188, the respective optimal signals that are to be used for the various clocking applications within the memory. Such clocking applications may include, for example, latching data into a data input latch, or presenting a clock signal to a synchronous clock output terminal for accompanying data read from the memory.

One output of multiplexer 184, e.g. T<0>, is coupled to the input of emulator circuit 186' (see FIG. 10A). The emulator circuit 186' emulates signal conditioning circuitry that may be associated with, for example, propagating data from a data output latch to a data output terminal. Such conditioning circuits may include, for example, shaping circuits, output buffers, or tri-state, buffers disposed in the data path immediately preceding the memory's data output terminals. With the emulator circuit 186' of the delay lock loop providing surrogate emulation of the conditioning circuits associated with the data output signal path, the control loop of the clock signal's compound delay lock loop will keep the clock signal as presented at the memory's output clock terminal in substantially synchronous relationship relative to the data signal presented to the memory's data output terminals. Accordingly, emulator circuit 186', by providing a propagation delay therethrough which emulates the data output signal path, enables the compound delay lock loop to maintain a substantially optimal timing relationship relative to the memory's data output signal, thereby compensating for timing fluctuations of the above-mentioned conditioning circuits.

Figure 13:
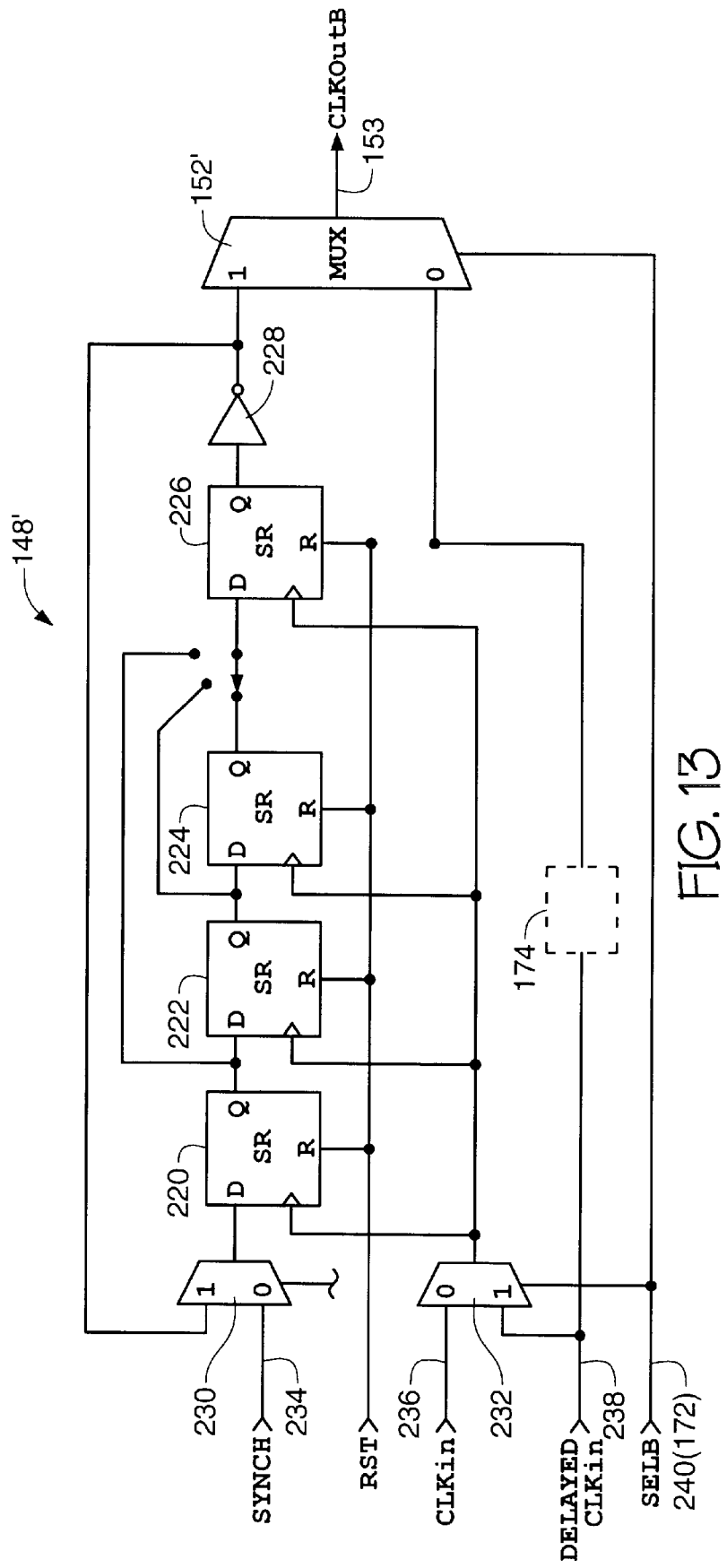
FIG. 13 is a schematic diagram of an exemplary divider and a multiplexer for the circuit B of FIG. 10.

The output of emulator circuit 186' is fed forward to divider-switch-B (148', 152'), which is exemplified in FIG. 13. Similar to FIG. 12, divider-switch-B includes a divider portion 148' and multiplexer 152'. Divider 148' is made up of a plurality of serially arranged D-flip-flops 220, 222, 224, 226. A multi-position switch-determines from which of the flip-flops 220, 222, 224 to source the input of flip-flop 226, and, accordingly, provides selective programmability of the divisor of divider 148' as explained earlier. Inverter 228 feeds the counter's output signal back to an input of multiplexer 230, which multiplexer selectively couples, as determined by control signal SelB, one of either the counter's fed-back output signal or an external synch signal to the D-input of first flip-flop 220. This arrangement is configured as a shift register during lock sequencing. The output of divider 142' is clocked into the input of the shift register, so that the outputs of each flip-flop in 148' will match the respective outputs of the flip-flops in 142'. When SELB selects feedback from inverter 228 at the end of the lock sequence, the shift register 148' is converted into a Johnson counter which is in lock-step with Johnson counter 142' of FIG. 12, as will be discussed in more detail below.

Control signal SelB at input 240, which corresponds to control line 172 of FIGS. 9A and 9B, controls the configurations of multiplexers 230, 232 and 152'. In a synchronizing operation mode, control signal SelB configures multiplexers 230, 232, 152' to couple the Synch signal 234 to the D-input of flip-flop 220, the ClkIn signal 236 to the clock inputs of the plurality of flip-flops, and the delayed clock signal, Delayed ClkIn through the optional delay unit 174 to output 153. For this synchronizing operation mode, as used during a portion of the initialization of the delay lock loop, the states of divider 148' are kept correlated to those of the first divider 142' in order to assure a stable continuity in the operation of the delay lock loop through one of its reconfiguration transitions, for example, when coupling the output of second divider 148' to the variable input 153 of the delay lock loop's phase detector 154. During this reconfiguration, control signal SelB sets multiplexers 230, 232 to couple the counter's fed-back output signal to the D-input of flip-flop 220, and to couple the delayed clock signal of input 238 to the clock inputs of the plurality of flip-flops respectively.

Absent the synchronizing operation mode of divider 148', state transitions of the divided variable signal at variable input 153 of phase detector 154 might otherwise be non-coincident with the transitions of the reference signal at reference input 155 at the time the delay lock loop is reconfigured. Accordingly, the delay lock loop might have to re-seek a synchronous locked state. Although the delay lock loop might eventually re-acquire lock, the re-acquisition process could introduce undesirable transients or noise into the control loop during operation of the delay lock loop, and accordingly extend the amount of time required for its initialization.

Accordingly, for the preferred, yet optional, present embodiment of the invention, and returning to FIG. 10, buffers 143 supply the input clock signal to divider-switch-B (148', 152') which corresponds to clock input 236 of FIG. 13. Furthermore, divider-switch-A (142', 150') of FIG. 10 supplies a synch output signal to be coupled to the synch input of divider-switch-B (148', 152') (i.e., the synch input 234 of FIG. 13) to facilitate pre-alignment of divider 148' during a segment of the delay lock loop's initialization.

Again, the output of divider-switch-B (148', 152') corresponds to variable input 153 of phase detector 154. Phase detector and charge pump 154, 156 receive the reference and variable input signals and output charge responsive to the phase differences determined therebetween. Exemplary phase detector and charge pump circuits 154, 156 are disclosed in U.S. patent application Ser. No. 09/260,216, filed Jan. 3, 1999, which is owned by the assignee of the present application, and which is hereby incorporated by reference in its entirety. For purposes of developing a better understanding of certain aspects of the present invention, a few exemplary elements of a phase detector and charge pump are described below with reference to FIGS. 14–17.

Figure 14:
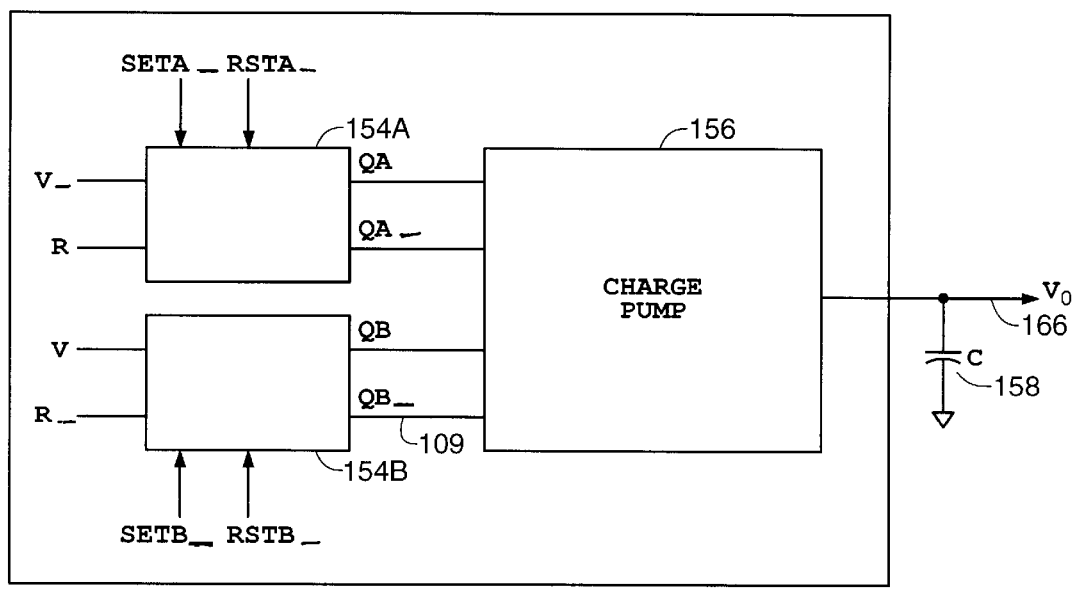
FIG. 14 is a block diagram for an exemplary phase detector and charge pump.
Figure 15:
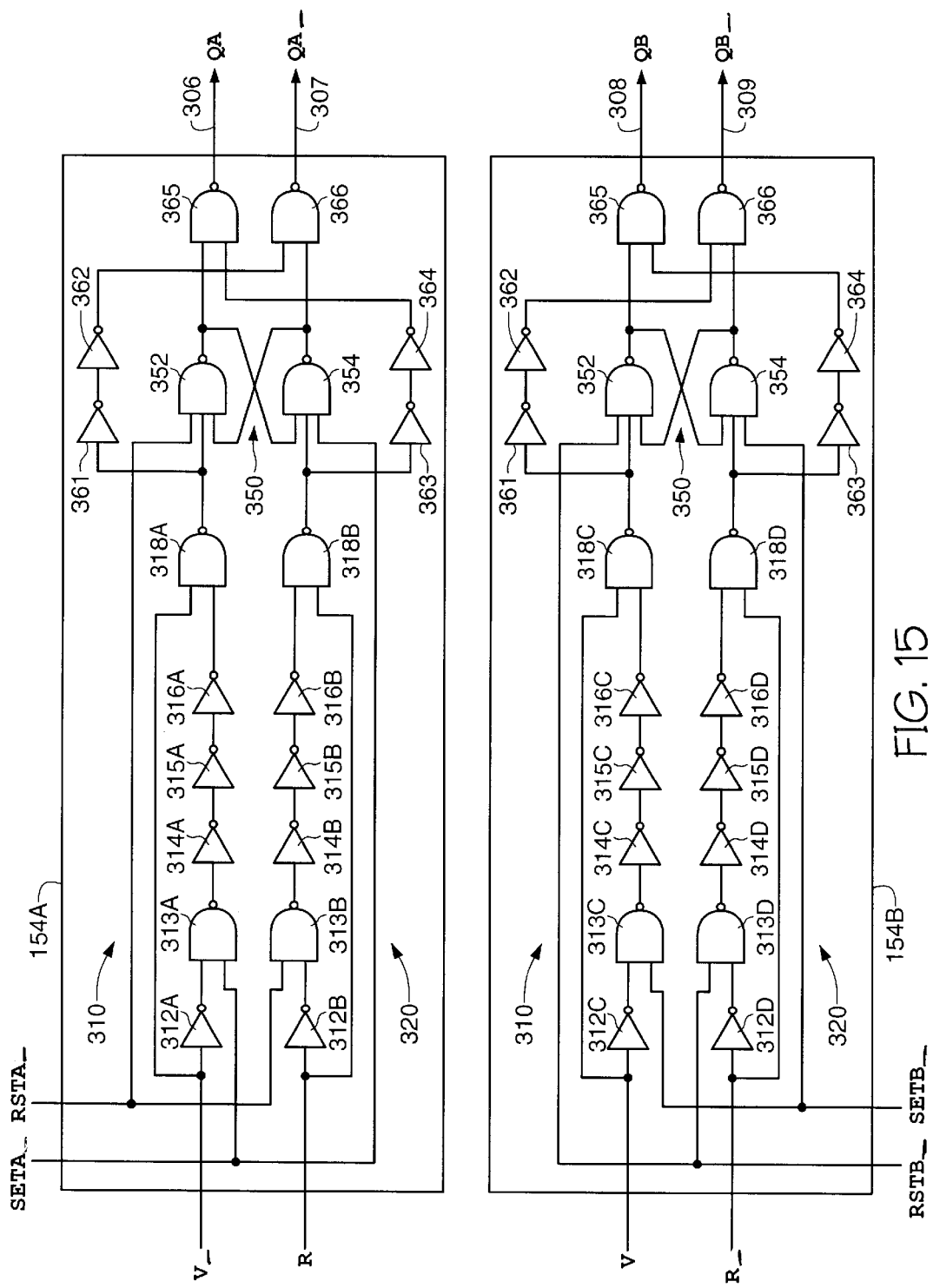
FIG. 15 is a schematic diagram of an exemplary phase detector circuit.

Referring to FIG. 14, phase detector 154 comprises a first channel 154A and a second channel 154B. The circuit of the first channel 154A receives four inputs, a variable complement signal V_, primary reference signal R, and control signals SETA_ and RSTA_. The control signals SETA_ and RSTA_ control set and reset operations of the first channel 154A of the phase detector. The second channel 154B of the phase detector corresponds to the first channel, with the exception that the input signals are the primary variable signal V, the reference complement signal R_, and control signals SETB_ and RSTB_ Moving forward with reference to FIG. 15, the first channel 154A of the phase detector comprises first and second pulse generating circuits 310, 320 respectively. Pulse generator circuit 310 comprises inverters 312A, 314A, 315A, 316A, NAND gate 313A, and NAND gate 318A. The variable complement signal V_ is coupled to the input of inverter 312A which inverter feeds a first input of NAND-gate 313A. The second input of NAND-gate 313A is coupled to receive the first control signal SETA_. The output of NAND-gate 313A drives the serial path comprising inverters 314A, 315A, 316A to a first input of NAND-gate 318A. The other input of NAND-gate 318A receives the variable complement signal V directly. For the following discussion, assume that SETA and RSTA_ are held at a logic "1" level.

In operation, when the variable complement signal V_ has been at logic 0 for an extended period of time, the steady-state condition of the pulse generator 310 will place the output of inverter 316A in a logic 1 level, which is presented to the first input of NAND gate 313A. With a logic 0 at the second input of NAND-gate 318A, the output of NAND-gate 318A is high. In dynamic operation, when the variable complement signal V_ transitions from 0 to 1, the new logic 1 level is presented to the second input of NAND-gate 318A while the low-to-high transition propagates through inverter 312A, NAND-gate 313A, and inverters 314A, 316A. During the period of time required for propagating the transition through the inverters and NAND-gate devices, both inputs of the NAND-gate are high so as to provide a logic 0 level at the output of NAND-gate 318A. Once the transition has propagated through the inverter devices, the first input of NAND-gate 318A will transition low, for returning the output of NAND gate 318A to a logic 1 level and completing the duration of the logic 0 level pulse.

The output of the pulse generating circuit 310 (i.e. the output of NAND-gate 318A) is coupled to a first input of 3-input-NAND-gate 352. NAND-gate 352 is configured in combination with NAND-gate 354 to provide a latch circuit, wherein the output of NAND-gate 352 is coupled to one of the inputs of NAND-gate 354, and wherein an output of NAND-gate 354 is coupled back to one of the inputs of NAND-gate 352. When pulse circuit 310 transitions from high to low, the low signal received at the first input of NAND-gate 352 will drive the output of NAND-gate 352 into a logic I level, which in turn drives an input of NAND-gate 354. Assuming other inputs of NAND-gate 354 are held high, the output of NAND-gate 354 will transition from high to low. Accordingly, latch 350 latches a logic 1 level at the output of NAND-gate 352, and a logic 0 level at the output of NAND-gate 354.

NAND gates 365 and 366 buffer the Q and Q outputs of flip-flop or latch 350 to the output terminals 306 and 307 for supplying signals QA and QA_. Inverters 361, 362 forward the output of NAND-gate 318A to an input of NAND-gate 366 and operate to expedite a transition of the output signal QA_ in response to a pulse of pulse generator 310.

For the previously described operation of pulse generator 310, it was assumed that the control signals SETA_ and RSTA_ were held at logic "1" during its normal operation. Accordingly, NAND-gates 313A and 318A functioned as inverters. However, either one of the control signals SETA_ or RSTA_ can be held low to provide a set or reset, respectively, of latch 350.

Pulse generator 320, like pulse generator 310, is configured to be responsive to a transition of reference signal R to produce a low pulse at the output of NAND-gate 318B with a pulse duration corresponding to the combined propagation delay of inverter 312B, NAND-gate 313B, and inverters 314B, 315B, 316B. Additionally, inverters 363, 364 propagate the output of NAND-gate 318B to an input of NAND-gate 365 to expedite a transition of the QA signal at output 306 responsive to pulse generator 320.

The second channel 154B of the phase detector operates similarly to the first channel 154A, but employees primary variable signal V and reference complement signal R_. To distinguish the outputs of the first and second channels, outputs 306, 307 of the first channel 154A are annotated to carry complementary signals QA and QA_, while the outputs 308, 309 of the second channel 154B are annotated to carry complementary signals QB and QB_.

Figure 16C:
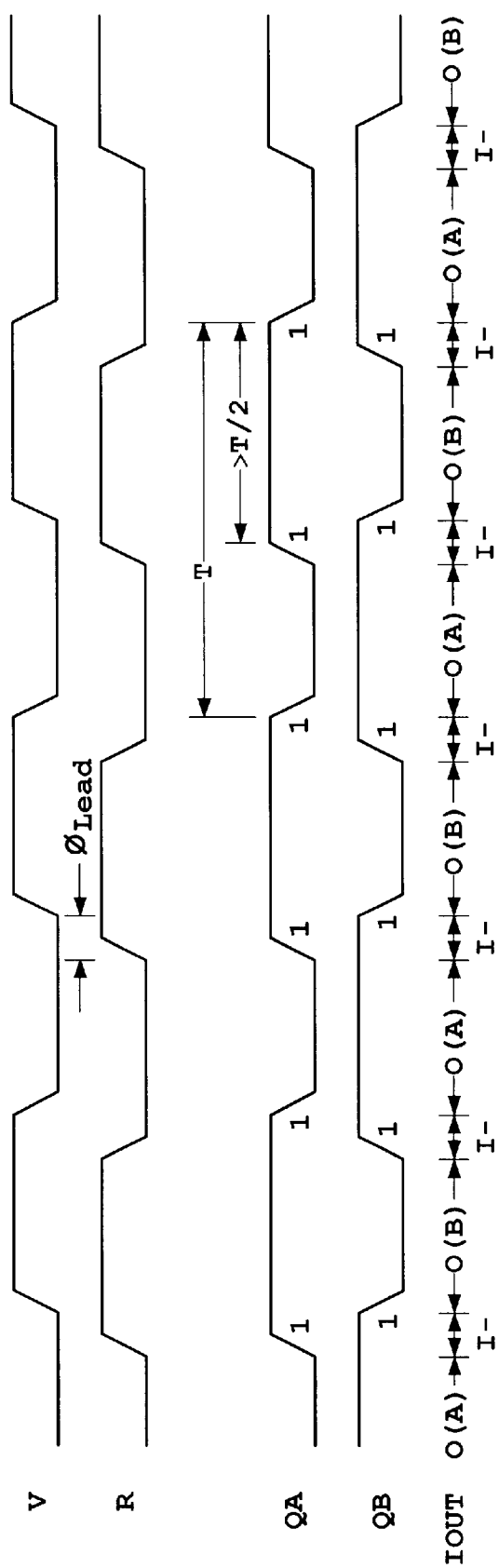
FIG. 16C is a timing diagram characterizing operation of the phase detector and charge pump of FIG. 14 when the phase of the variable signal at the phase detector lags that of the reference clock input.

The timing diagrams of FIGS. 16A, 16B and 16C characterize operation of the phase detector under three conditions. In a first condition, referencing FIG. 16A, variable signal V is phase coherent with reference signal R, and the phase detector's output signal QB corresponds to a complement of the phase detector's second output signal QA. Under this condition, charge pump 156 of FIG. 14 (which will be addressed in detail with reference to FIG. 17) provides zero output current ($I_{out}$).

In a second operating condition, referencing FIG. 16B, the phase detector receives a reference signal R which lags the variable signal by a given phase lag $\Phi_{lag}$. Under this phase lag relationship, the output signals QA and QB have overlapping low states that correspond to the phase lag between the variable and reference signals. During these overlapping low states, charge pump 156 will respond with a positive output current ($I^+$).

Finally, when the phase of reference signal R leads that of variable signal V by a phase lead $\Phi_{lead}$, the phase detector's output signals QA and QB will have overlapping high states, as shown in FIG. 16C. During these periods of overlapping high states, charge pump 156 will respond with a negative output current ($I^-$).

Figure 17:
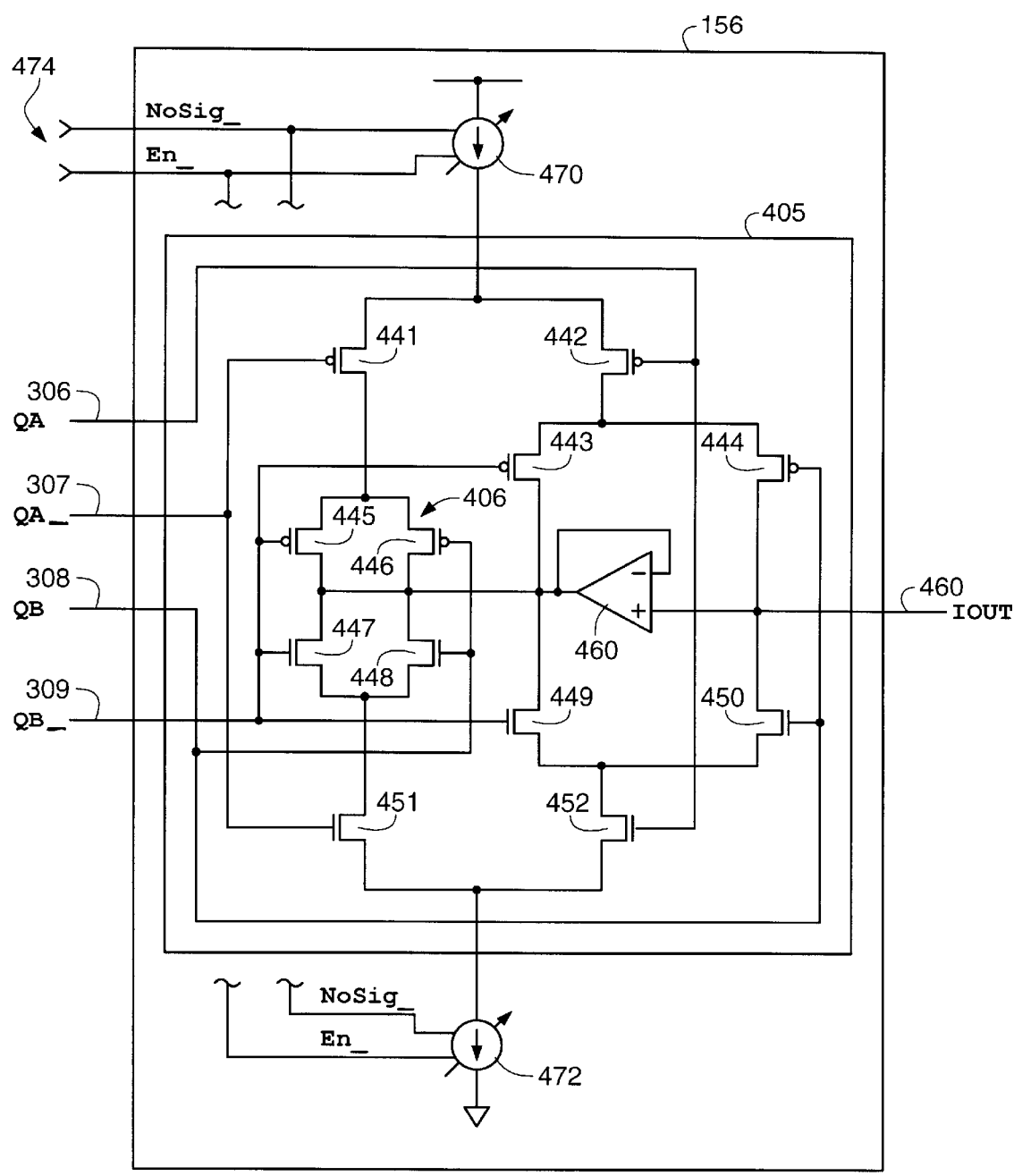
FIG. 17 is a schematic diagram of an exemplary charge pump.

A particular exemplary embodiment of charge pump 156, referencing FIG. 17, receives four signals at inputs 306, 307, 308, 309, which correspond to the QA, QA_, QB, and QB_ output signals from the first and second channels of phase detector 154 of FIG. 14. Bias control signals 474 bias the charge pump by establishing current levels for current sources 470 and 472. P-channel MOSFET 442 has its source coupled to current source 470, and its drain coupled to the source of P-channel MOSFET 444. The drain of P-channel MOSFET 444 is coupled to the drain of N-channel MOSFET 450 at the charge pump's output 460. The source of MOSFET 450 is coupled to the drain of N-channel MOSFET 452, which has its source coupled to current source 472.

During operation of the charge pump, the signal QA at input 306 drives the gates of MOSFETs 442 and 452, while the signal QB at input terminal 308 drives the gates of MOSFETs. 444 and 450. When the signal QA is high, P channel MOSFET 442 is disabled and N-channel MOSFET 452 is enabled. Additionally, if signal QB is high, then N-channel MOSFET 450 is enabled and MOSFET 444 disabled. Accordingly, the charge pump 156 may sink a current through N-channel MOSFETs 450, 452 of a magnitude equal to the current established by current source 472. Alternatively, if QA and QB are both low, then MOSFETs 442, 444 are enabled and MOSFETs 450, 452 disabled so that the charge pump may provide an output current at terminal 460 of a magnitude equal to the current established by current source 470. Finally, when the input signals QA and QB are not equal, the charge pump neither sinks nor sources an output current at terminal 460. Further description of this exemplary charge pump 156 and its associated operation may be found in U.S. patent application Ser. No. 09/260,212, filed Mar. 1, 1999, assigned to the assignee of the present application and hereby incorporated by reference in its entirety.

Referring again to FIG. 10, the output of charge pump 156 is coupled, via switch 160, to capacitor 158. Capacitor 158 integrates the current provided by charge pump 156 to establish an accumulation of charge (and associated voltage) that is related to the polarity, magnitude and duration of the charge pump's current output. Accordingly, the control voltage $V_{tune}$ at terminal 166 will ramp up or down dependent upon the polarity of the charge pump's output current. Again, as addressed previously herein, the control voltage $V_{tune}$ at control terminal 166 adjusts the amount of delay provided by variable delay element 144.

Figure 18A:
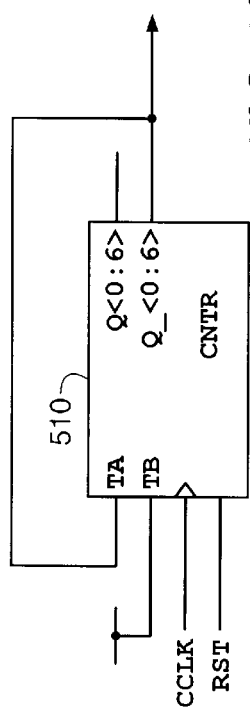
FIG. 18 consisting of FIGS. 18A–18C is a schematic diagram of an exemplary lock sequencer for initializing a delay lock loop pursuant to an exemplary embodiment of the present invention.
Figure 18B:
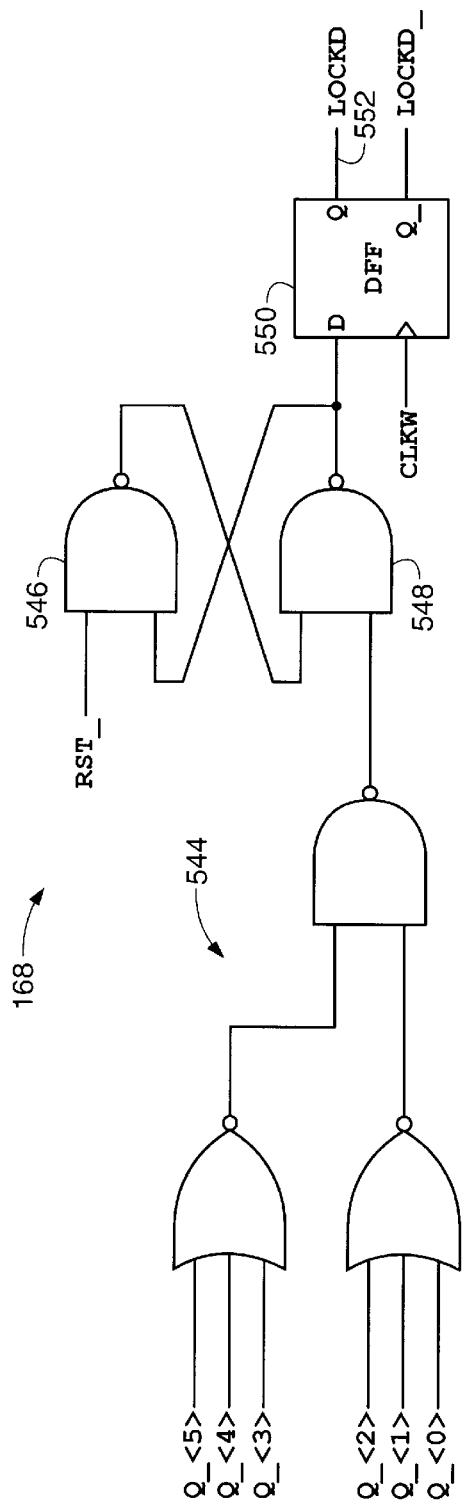
Figure 18C:
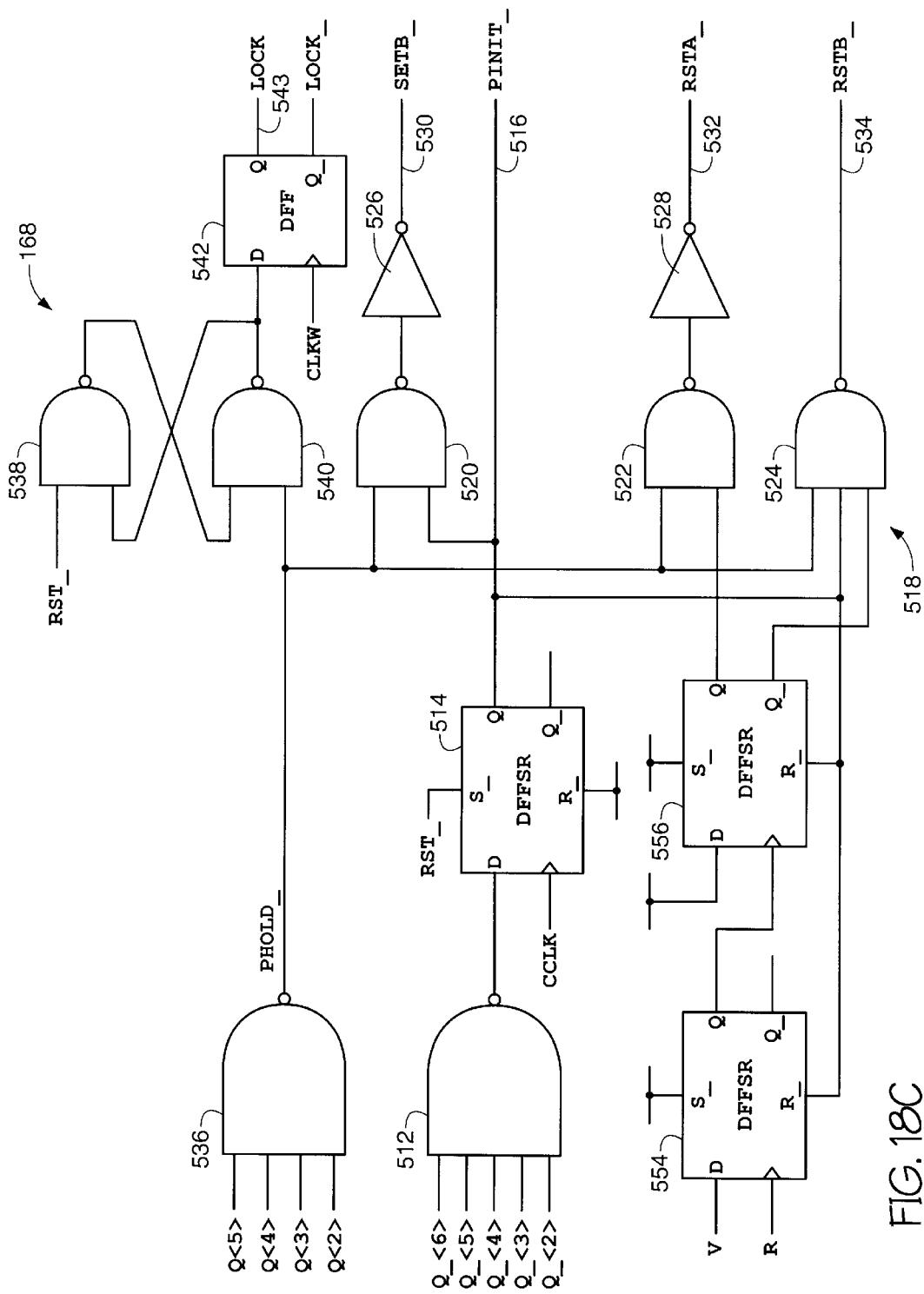

To initialize a delay lock loop in accordance with an exemplary initialization sequence of the present invention, a lock sequencer 168 generates a plurality of carefully timed control signals for effecting various configurations and reconfigurations of the delay lock loop. Referring to FIGS. 18A–C, an exemplary lock sequencer 168 comprises counter 510, which is shown in detail in FIG. 18A. In accordance with a preferred embodiment, counter 510 is a 7 bit counter configured to receive a clock signal and a reset signal. When operating, counter 510 may receive a reset signal for clearing its primary outputs Q<0:6>. Thereafter, and using circuitry well known in the art, each leading-edge transition of the received clock will increment the counter through a known binary sequence until the $7^{th}$ bit has transitioned high. Likewise, the complementary bits Q_<0:6> will follow the complement sequence.

It is noted that the counter 510 receives its input clock CCLK from output 204 of divider-switch-A (see FIGS. 10 and 12). Accordingly, each period of the counter's received clock corresponds to two, four, or six multiple periods of the delay lock loop's input clock signal CLKIN, wherein the multiple is determined by the divisor of divider 142'.

Further referencing FIG. 18B, logic circuitry 544 receives six complement output signals Q_<0:5> from counter 510. So long as one of the six signals Q_<0:5> is high, the output of logic circuit 544 will be high. The output of logic circuitry 544 feeds an input of latching NAND-gates 546, 548. The output of NAND-gate 548 drives the D-input of D-flip-flop 550. The Q output of D-flip-flop 550 provides terminal 552 the LockD control signal for configuring the delay lock loop's second switch 152 as discussed previously with respect to FIGS. 8, 9A, 9B, and 10. After a counter reset, the Q_<0:5> bits of counter 510 are high and the control signal at terminal 552 will transition to a logic 0 level upon D-flip-flop 550 receiving the next CLKIN edge. This control signal will remain low until all Q_<0:5> bits of the counter have transitioned low and another CLKIN edge has been received by flip-flop 550.

Referring to FIG. 18C, NAND-gate 536, latching NAND-gates 538, 540 and flip-flop 542 are configured to provide a Lock control signal at terminal 543 responsive to the counter's output signals Q<2:5>. The output of NAND-gate 536 feeds an input of latching NAND-gates 538, 540. The other input of the latching NAND gates is coupled to receive the reset signal RST_. The output of NAND-gate 540 drives the D-input of D-flip-flop 542, which flip-flop provides the Lock control signal for controlling the configuration of the first switch 150 of the delay lock loop, as discussed previously with respect to FIGS. 8, 9A, 9B, 10 and 12. When the counter is reset, the signals Q<2:5> are all low to effect a logic 1 level at the output of NAND-gate 536. When signals Q<2:5> all go high, the output of NAND-gate 536 will go low. Latch 538, 540 receives the logic 0 level and responds by presenting a logic 0 level to the D-input of flip flop 542. Accordingly, upon receipt of the next CLKIN edge, the flip-flop transitions the Lock control signal to a logic 0 level.

NAND-gate 536 also drives an input of three other NAND-gates 520, 522, and 524, which are associated with generating the control signals SETB_, RSTA_ and RSTB_ respectively. As discussed previously with respect to FIGS. 10 and 14–17, these set and reset signals can be used to control various operations of the circuits of the delay lock loop, including phase detector 154 and charge pump 156. Again, when the counter receives a reset, it advances its count until eventually all of the Q<2:5> bits are high and the output of NAND-gate 536 transitions low. For one cycle of CCLK, the output of NAND-gate 536 remains low. But once the counter's $7^{th}$ complement bit Q_<6> transitions low, the counter's count sequence is complete, and the counter will provide logic 0 levels for the Q<2:5> bits such that the output of NAND-gate 536 returns to a logic 1 level.

Further referencing FIG. 18C, NAND-gate 512 comprises five inputs that are coupled to respective complement outputs Q_<2:6> of counter 510. The output of NAND-gate 512 drives the D-input of flip-flop 514, which flip-flop sources a control signal PInit_at terminal 516. The PInit_ control signal of flip-flop 514 also drives an input of NAND-gate 524 associated with the RSTB_ control signal, an input of NAND-gate 520 associated with the SETB_ control signal, and, additionally, the reset terminals of D-flip-flops 556 and 554. When the Q_<2:6> complement bits of counter 510 all transition high following a counter reset, NAND-gate 512 presents a logic 0 level to the input of D-flip-flop 514. The output of D-flop-flop 514, accordingly, will remain low with each CCLK transition until the RST_ signal has cleared and the $3^{rd}$ complement bit Q_(2) of the counter has transitioned low; whereupon, the flip-flop 514 captures and outputs a logic 1 level upon receipt of the next CCLK edge.

TABLE 1

|  | Q6 | Q5 | Q4 | Q3 | Q2 | Q1 | Q0 |
|---|---|---|---|---|---|---|---|
| 0T | 0 | 0 | 0 | 0 | 0 | 0 | 0 |
| 1T | 0 | 0 | 0 | 0 | 0 | 0 | 1 |
| 2T | 0 | 0 | 0 | 0 | 0 | 1 | 0 |
| 4T | 0 | 0 | 0 | 0 | 1 | 0 | 0 |
| 8T | 0 | 0 | 0 | 1 | 0 | 0 | 0 |
| 16T | 0 | 0 | 1 | 0 | 0 | 0 | 0 |
| 32T | 0 | 1 | 0 | 0 | 0 | 0 | 0 |
| 64T | 1 | 0 | 0 | 0 | 0 | 0 | 0 |

A description through an exemplary counter sequence now follows with reference to the schematic of FIG. 18 and Table 1. At start-up, the reset signal RST transitions high, and, likewise, its counterpart complement reset signal RST_ transitions low. The primary outputs Q<0:6> of counter 510 are set low, while the complement outputs Q_<0:6> are set high. Responsive to the counter reset and the complement reset signal RST__, latching NAND-gates 546,548 output a logic 0 level at the output of NAND-gate 548, the control signal Phold__ at the output of NAND-gate 536 transitions high, and latching NAND-gates 538, 540 output a logic 0 level at the output of NAND-gate 540. Additionally, flip-flop 514, responsive to the complement reset signal RST__ at its active low set input, outputs a logic 1 level while receiving at its input a logic 0 level from NAND-gate 512. Under these setup conditions, D flip-flops 514, 550 and 542 are presented with logic 0 levels at their D inputs and in a condition for latching and outputting logic 0 level output signals upon receipt of each flip-flop's respective next clock transition. The lock sequencer 168 is configured to begin the initialization sequence for setting the delay lock loop into a stable operating position.

Referencing Table 1, following a first CCLK period 1T after the reset, the counter's least significant bit Q0 transitions high and its complement counterpart Q__0 transitions low. Logic circuit 544 maintains a same level as presented to latching NAND-gates 546, 548, and control signal Phold__at the output of NAND-gate 536 remains the same as presented to latching NAND-gates 538, 540. However, the outputs 552, 543 of respective D-flip-flops 550, 542 transition low for effecting low state transitions of the LockD and Lock control signals respectively. Accordingly, first switch 150 of the delay lock loop, (see FIGS. 8, 9A, 9B, 10) is configured to couple the divided signal to variable delay element 144, and second switch 152 is configured to couple variable input 153 of phase detector 154 to receive its signal from emulator block 146 or 186.

Figure 19:
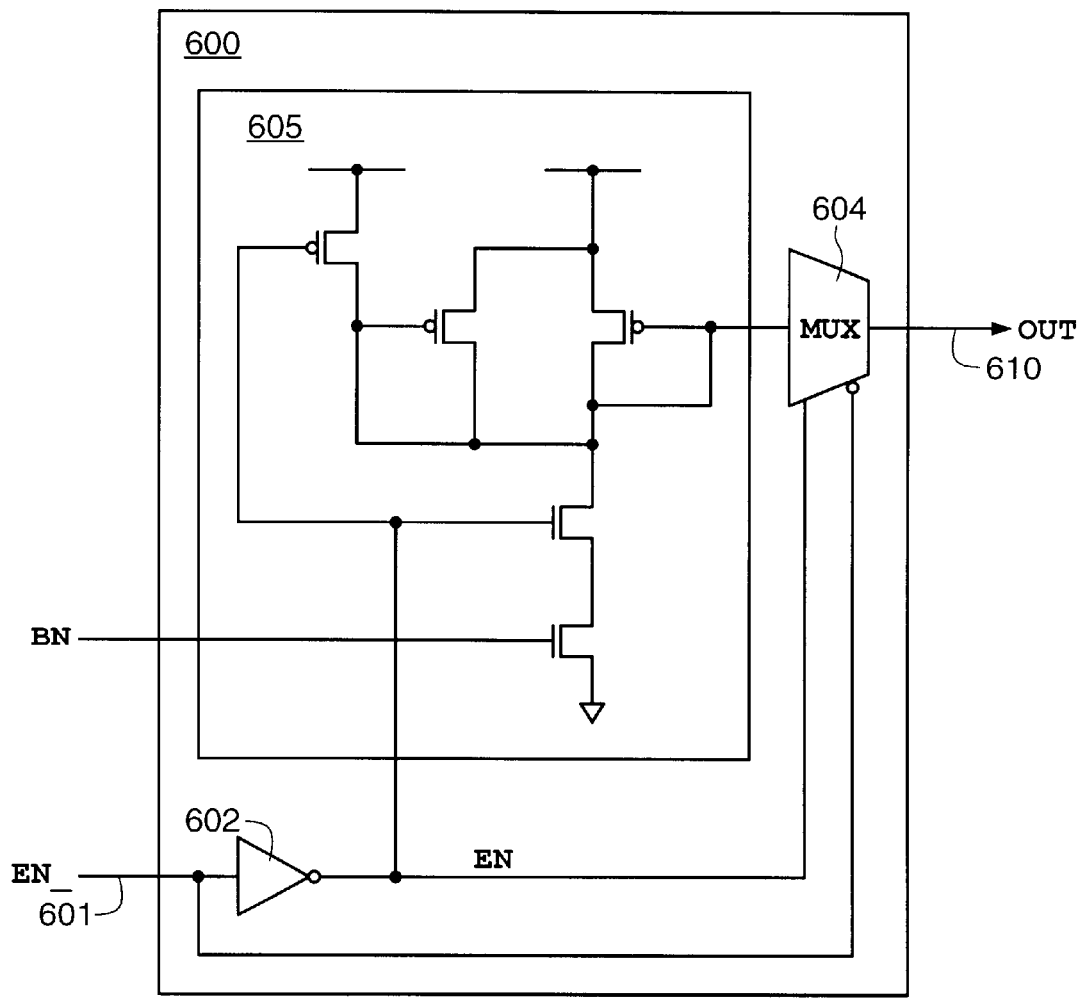
FIG. 19 is a schematic diagram of an exemplary voltage clamp circuit for clamping a control signal during an initialization sequence of an exemplary embodiment of the present invention.

Additionally, flip-flop 514 transitions the PInit__ control signal low, which will cause the outputs of NAND-gates 520 and 524 to transition high. As a result, control signal SETB__transitions low via inverter 526 and control signal RSTB__ transitions high. The low PInit__ control signal will also reset flip-flops 554 and 556. The low output from flip-flop 556 will feed NAND-gate 522 to effect a logic 0 level for control signal RSTA__ at output 532 via inverter 528. With control signals SETB__ and RSTA__ both low, the first and second channels of phase detector 154 (see FIGS. 15 and 17) will provide the QA and QB output signals at logic 0 and logic 1 levels respectively. Therefore, charge pump 156 (see FIG. 17) will have its output configured in a tri-state condition, with P-channel MOSFET 444 and N-channel MOSFET 452 both disabled. With output 460 of charge pump 156 in a tri-state condition, exemplary clamp circuit 164 (see FIGS. 10 and 19) can be enabled to supply the integrating capacitor 158 a bias voltage from bias circuit 605. To enable the clamp circuit, the logic 0 level of control signal PInit configures multiplexer 604 to couple the output voltage of bias circuit 605 to output 610.

Accordingly, integrating capacitor 158 will be charged with the output voltage level of bias circuit 605, which level is previously selected to adjust variable delay element 144 to its lower delay setting.

Continuing the count sequence, and further referencing Table 1, after three more CCLK cycles, at time 4T, output Q2 of the counter 510 becomes a logic 1 and its complement output Q__2 becomes a logic 0. In response, the output of NAND-gate 512 will transition high, whereby D-flip-flop 514 will transition the PInit__ control signal high at the next CCLK transition (at time 5T). Once the PInit__ control signal transitions high, the control signals SETB__ and RSTB__ take on high and low values respectively.

Regarding control signal RSTA__, flip-flop 556 maintains a logic 0 level at its output to NAND-gate 522 so long as transitions of the variable signal V lag those of the reference signal R by less than 180 degrees. However, beyond time 5T, once an upward transition of the variable signal V at the D-input of flip-flop 554 lags an upward transition of the reference signal R at the clock input of flip-flop 554 by more than 180 degrees, flip-flop 554 will then capture a high value for sending a transition to the clock input of flip flop 556. Accordingly, flip-flop 556 will capture a logic 1 level for output to-NAND-gate 522. In other words, while the variable signal lags the reference signal by less than 180 degrees, phase detector 154 will output logic 0 levels for the QA and QB signals that are provided to charge pump 156 (see FIGS. 15 and 17) and charge pump 156 will output a positive current I$^+$of a magnitude corresponding to that of current source 470. It is understood that the current source 470 will have been re-enabled responsive to the PInit control signal returning to its logic 1 level. With charge pump 156 providing positive output current, capacitor 158 accumulates charge for ramping the control signal V$_{tune}$ upwardly to increase the delay of variable delay element 144. Increasing the delay of variable delay element 144, in turn, delays the variable signal V relative to the reference signal R at flip-flop 554. The integration of the output current and ramping of the control signal V$_{tune}$ continue until a sufficient phase lag has been introduced to the variable signal V by variable delay element 144 to enable a rising transition of the reference signal R to capture a logic 1 level of the variable signal V.

Once the variable signal V has been sufficiently delayed, the D-flip-flop 554 latches a logic 1 level for output to the clock input of D-flip-flop 556. Again, as discussed previously, flip-flop 556 (which has its D-input held high) receives the logic 1 level transition at its clock input and captures the logic 1 state for output to NAND-gate 522, while the complement output Q__ of flip-flop 556 is coupled to an input of NAND-gate 524. Once the control signals RSTA__ and RSTB__ have both transitioned high, normal operation of the delay lock loop's phase detector and charge pump 154, 156 ensues. In this fashion, the phase detector and charge pump 154,156 provide an upward ramping of the control signal V$_{tune}$ for adjusting variable delay element 144 away from its previously clamped, minimum delay setting. Feedback will now cause the delay to continue to increase until V lags R by 360 degrees. Without this initialization sequence, the loop would have attempted to lock at zero degrees, which is impossible.

At time 32T, the counter's sixth bit Q5 transitions high and its corresponding complement bit Q__5 transitions low. Eventually, at time 60T, all the inputs of NAND-gate 536 are high, and its output transitions low. Accordingly, the D-input of flip-flop 542 is presented a logic 1 level and the control signals SETB__ and RSTA__ at terminals 530, 532 respectively, both transition low. In response to this transition, phase detector 154 (see FIG. 15) provides logic 0 and logic 1 levels for the respective QA and QB output signals, thereby configuring the output 460 of charge pump 156 into a tri-state condition. With the output of charge pump 156 disabled, capacitor 158 will hold the voltage level of control signal V$_{tune}$. Thus, the tri-state operability of charge pump 156 has been likened to switch 160 as was previously discussed with respect to FIGS. 8, 9A and 9B. However, for a preferred embodiment, the functionality of switch 160 is understood to be provided by the tri-state operability of charge pump 156.

After another CLKIN edge, at time 60T$^+$, D-flip-flop 542 provides a logic 1 level for is control signal Lock at terminal 543 which will configure the first switch 150 (see FIGS.

8–10) to couple the input clock signal directly to variable delay element 144. Next, at time 63T, all six bits Q⁻<0:5> will be low at the input of logic circuit 544, so that D-flip-flop 550 will provide a logic 1 level for the control signal LockD at terminal 552 upon receipt of the next clock edge at time 63T⁺. Accordingly, the second switch 152 is configured to couple the output of second divider 148 to the variable input 143 of phase detector 154. It will be noted that the SETB_ and RSTA_ control signals are held low during this transition interval to keep the output of charge pump 156 in a tri-state condition to preserve the value of the control signal $V_{tune}$ at capacitor 158 while the other signals of the newly reconfigured delay lock loop stabilize.

In accordance with this embodiment, and referring to the timing diagram of FIG. 11, a delay is provided between the upward transition of the control signal Lock at terminal 543 relative to the upward transition of the control signal LockD at terminal 552. By providing such a delay before reconfiguring the second switch 152, the new input signal propagates through variable delay element 140, emulator circuit 146 and second divider 148 (see FIGS. 8, 9A, 9B) before the second switch couples the resultant signal to the phase detector. Accordingly, and again, pursuant the present disclosure, the control loop is protected from signal transients that may be associated with the delay lock loop's reconfiguration. In addition, the second divider can be optimally preset in order to provide output transitions to the phase detector that are substantially synchronous relative to those which would otherwise have been presented to the phase detector before the delay lock loop's reconfiguration.

Nearing the conclusion of the counter sequence, when the 7th bit, Q6, of counter 510 transitions high at time 64T, the low complement bit Q⁻6 is fed back to the counter's input for signaling a conclusion of the counter sequence. Likewise, pursuant the binary sequence, the remaining bits Q<0:5> transition low, while the complement bits Q_<0:5> transition high. In response, NAND-gate 536 will transition high, and the control signals SETB_ and RSTA_ will also transition high for beginning normal operation of the delay lock loop with its variable delay element initialized to a middle region of its adjustable range. With the variable delay element initialized in this fashion, the delay lock loop can reliably compensate for delay fluctuations of emulator block 186, vernier delay lock loop 182, and associated multiplexer 184 by adjustment of variable delay element 144 given that the variable delay element has been initialized away from its lower limit.

For the exemplary lock sequencer 168 described above with reference to FIG. 18, various delays and pulse durations were realized using particular combinations of the counter's output bits in order to establish a variety of control signals and durations for driving the initialization of the delay lock loop. It will be understood, that alternative delays and control signal durations could be provided via other combinations of the counter bits and clock frequency, or by using other known state machines to sequence the configurations of the delay lock loop through the initialization sequence of the present invention.

Figure 20A:
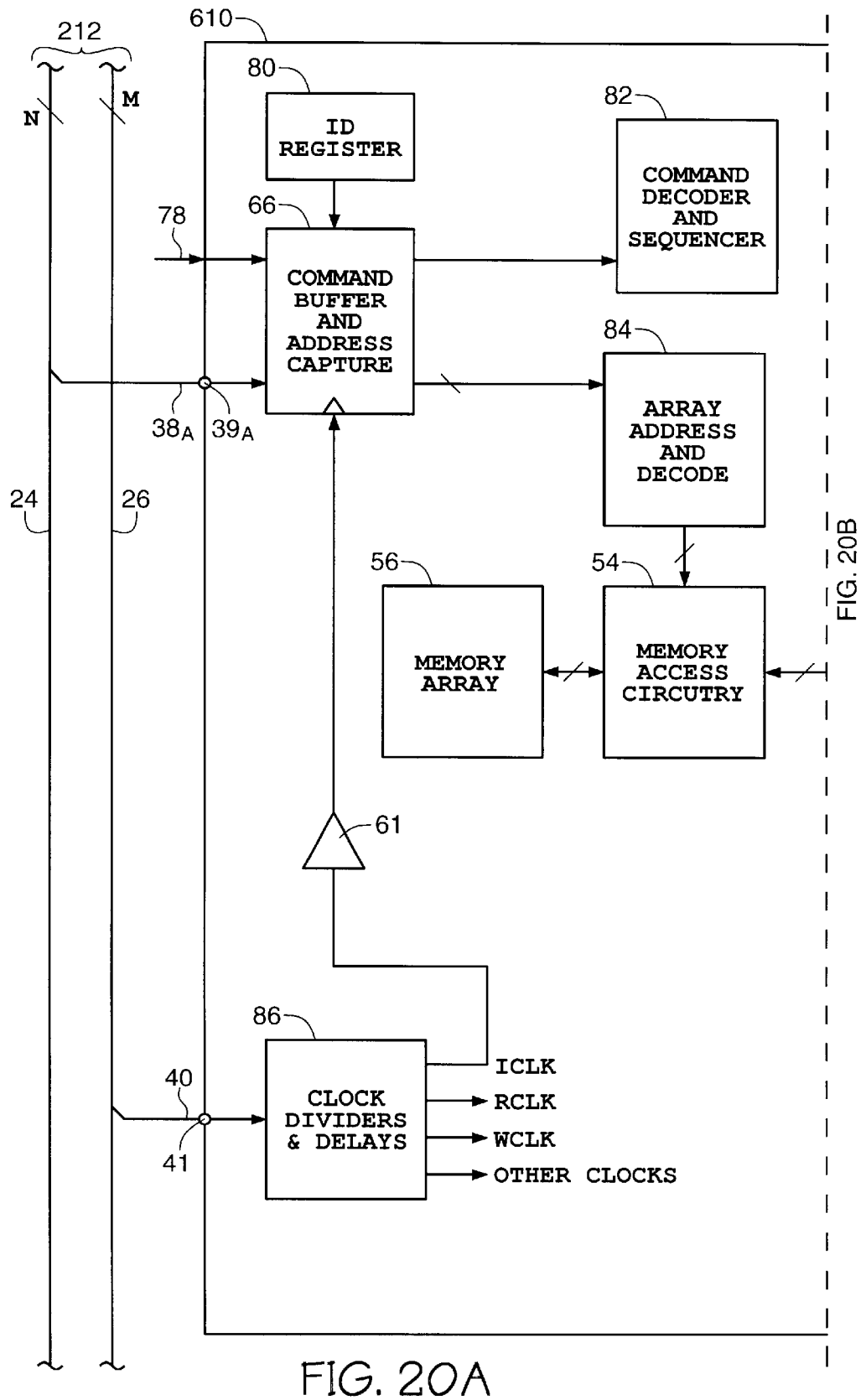
FIG. 20 consisting of FIGS. 20A–20B is a simplified block diagram representative of a synchronous memory device, incorporating read and write data circuitry in accordance with an exemplary embodiment of the present invention.
Figure 20B:
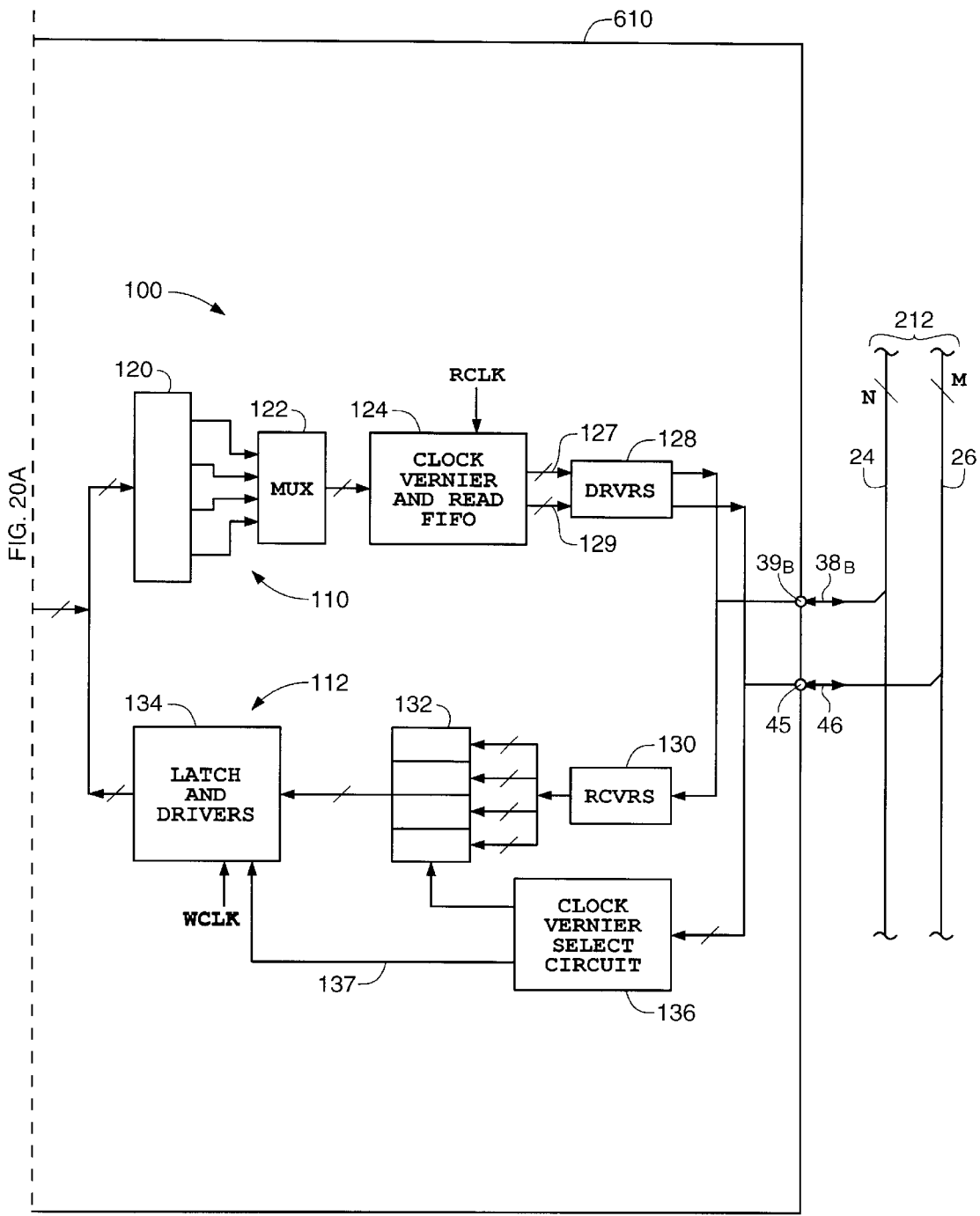

In accordance with a further exemplary embodiment, and referring to FIG. 20, a synchronous memory device 610 includes data path subsystem 100 for interfacing memory array 56 with bus 212 to exchange data therebetween. Known command and decode circuitry interpret command and address information that is received from the bus. Command decoder and sequencer 82, upon determining a valid command for the memory device, enables decode circuit 84 to decode an address associated with accessing the memory array 56.

When receiving command data within command register 66 of the synchronous memory device 610, clock circuit 86 receives a system clock from clock bus 26 via line 40 and provides command register 66 an internal clock signal ICLK that is appropriately timed for capturing and latching command data. Clock circuit 86 preferably comprises a delay lock loop of a previously described exemplary embodiment of the present invention, e.g., a compound delay lock loop as previously described herein with respect to FIGS. 9A and 9B. The delay lock loop is configured to source internal clock signal ICLK as an optimally delayed representation of the system clock such that transitions of ICLK are synchronous with, and relative to, centers of the data eyes of the command data signal received at command register 66. Emulator circuitry 186 of such delay lock loop, preferably emulates circuitry (e.g., multiplexer 184 and associated drivers) involved in propagating ICLK to command register 66.

Figure 1:
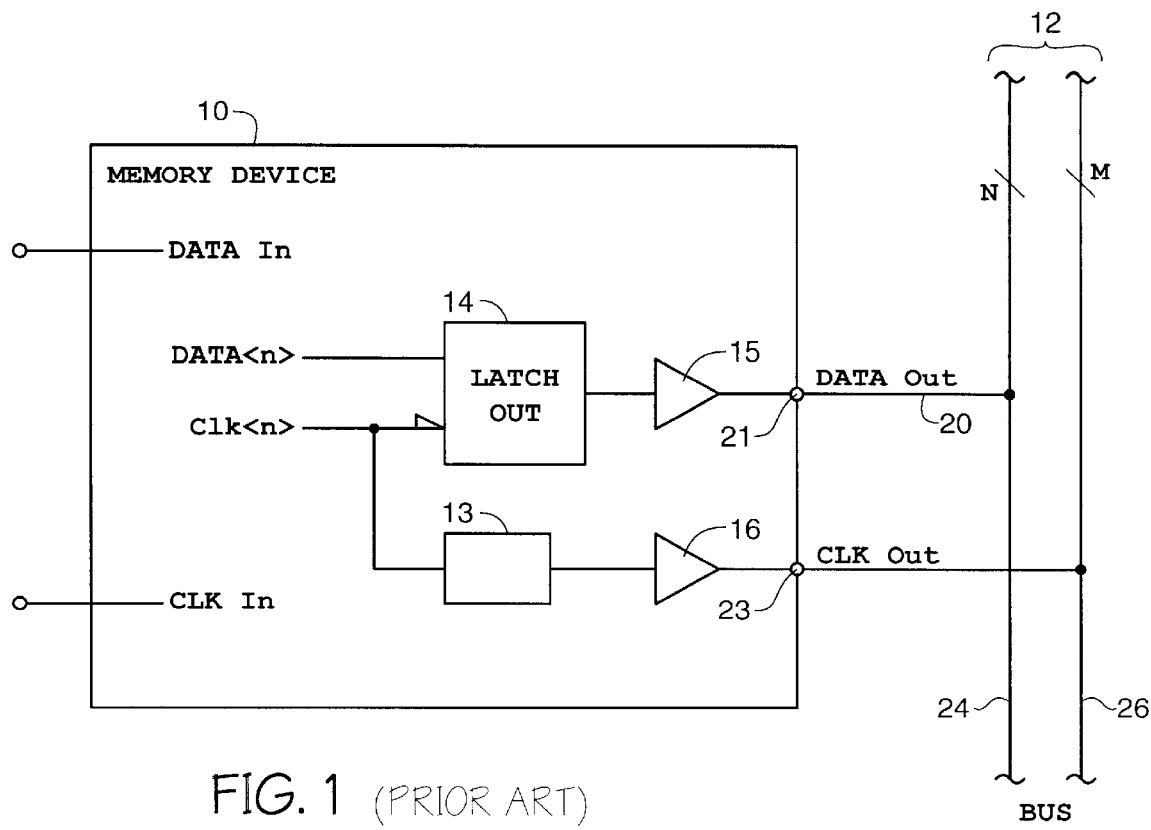
FIG. 1 is a simplified schematic diagram of an exemplary prior art synchronous memory device.
Figure 2:
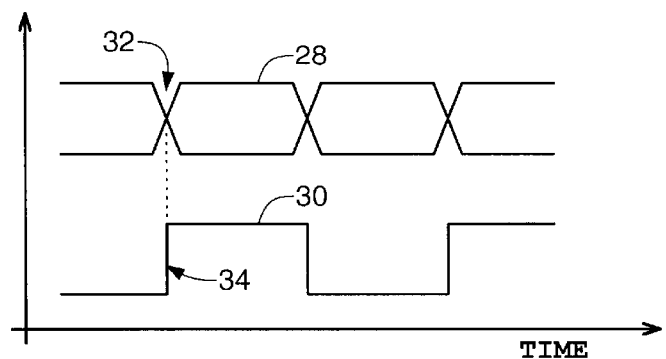
FIG. 2 is a simplified timing diagram illustrating signals associated with sending data out of a memory device.
Figure 3:
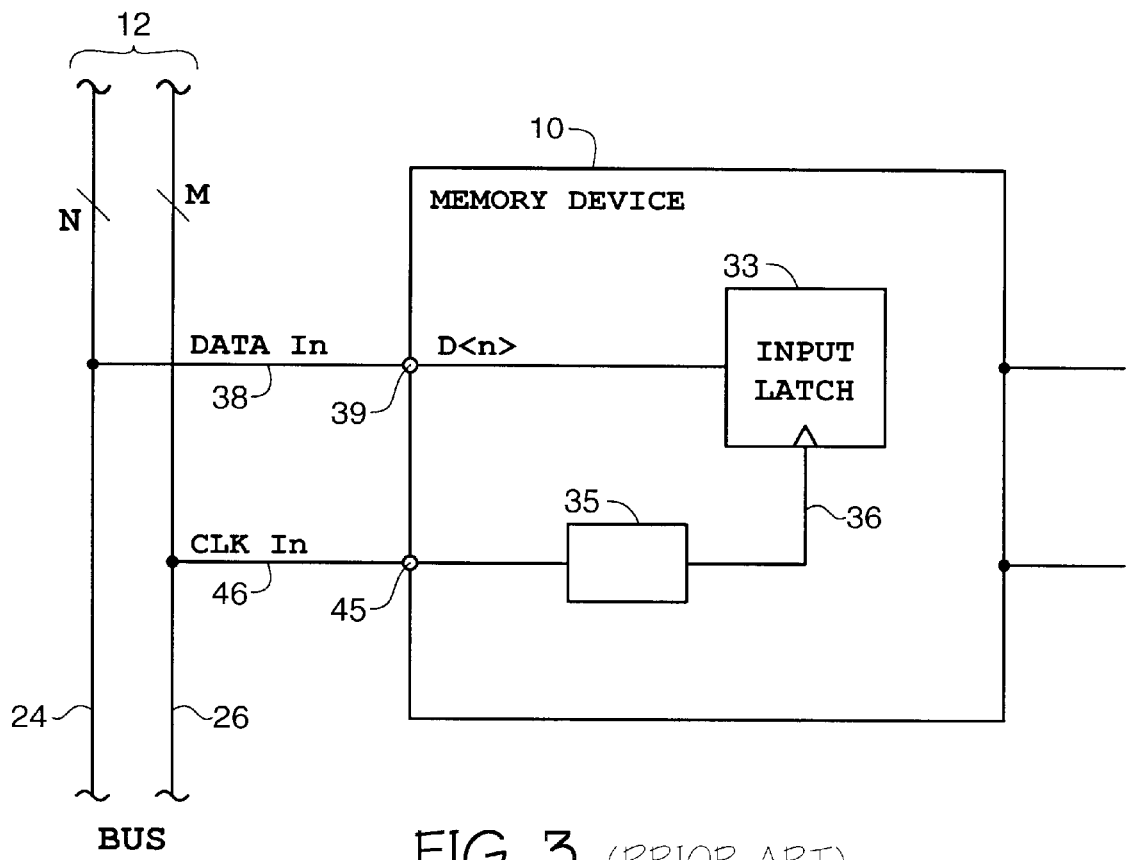
FIG. 3 is a simplified schematic diagram representative of an exemplary prior art synchronous memory device coupled to a bus for receiving data.
Figure 4:
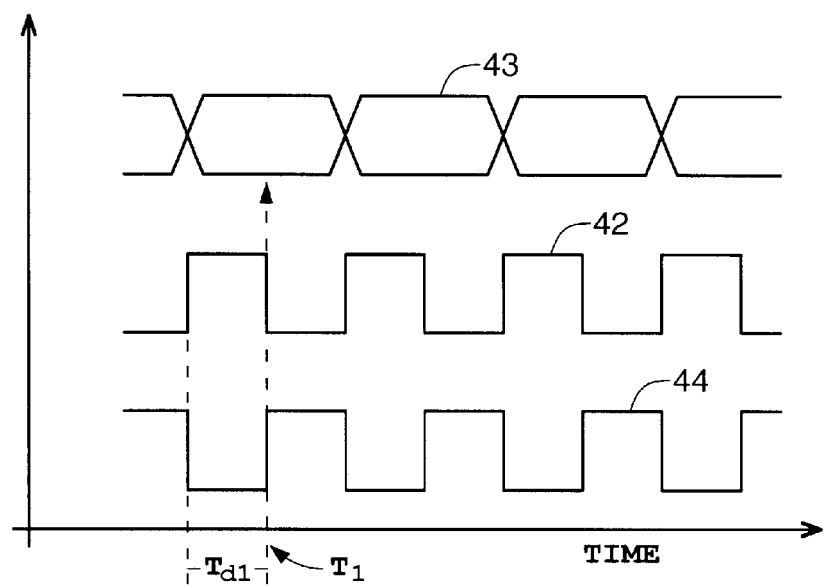
FIG. 4 is a timing diagram illustrating signals associated with receiving data.
Figure 5:
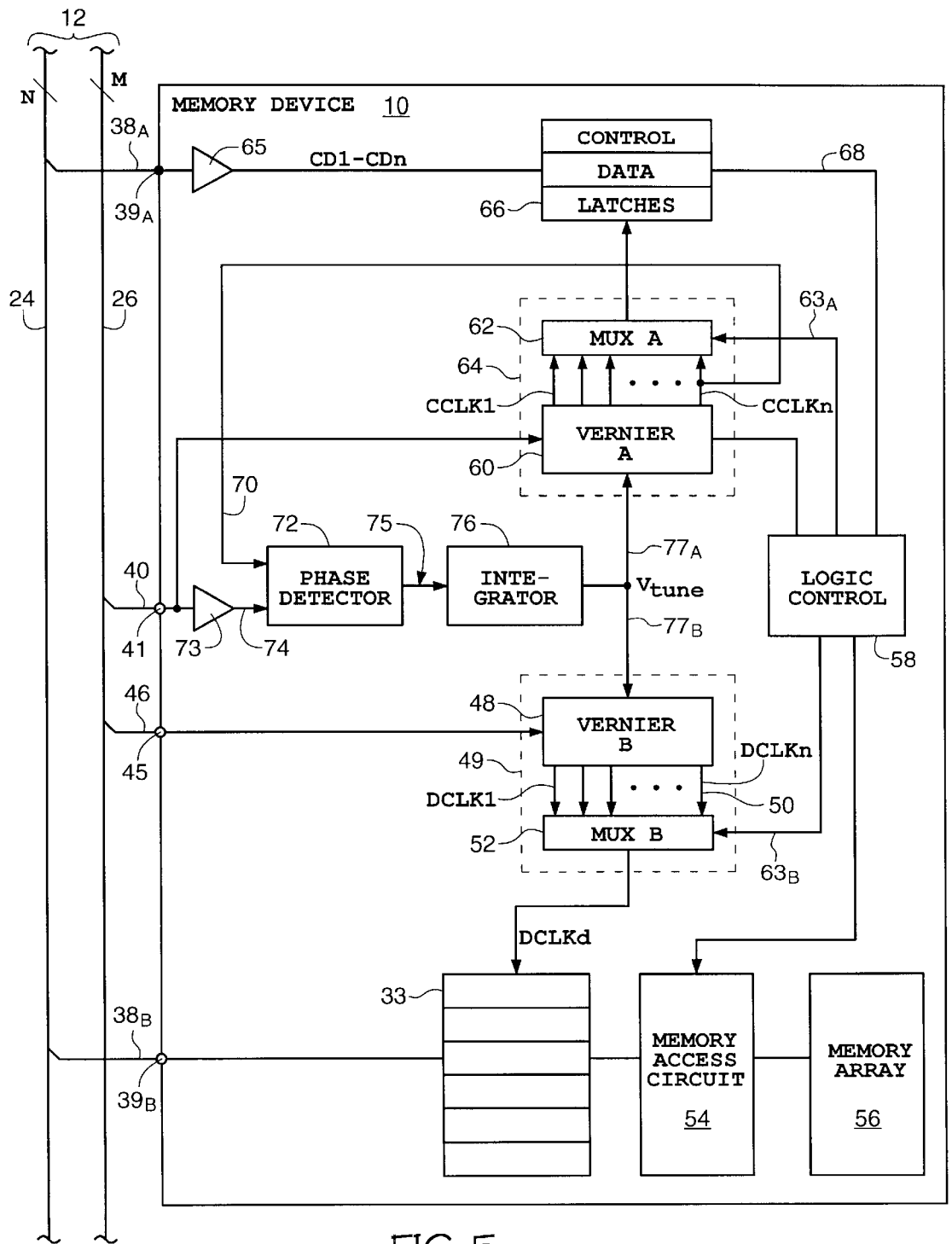
FIG. 5 is a schematic diagram representative of a prior art synchronous memory device incorporating circuitry for receiving command data and circuitry for receiving write data.

Further referencing FIG. 20, data path subsystem 100 of synchronous memory 610 comprises write channel 112 and read channel 110. Write channel 112 includes receivers 130 which are coupled to receive data from data bus 24 of synchronous bus 212 by way of lines 38B and data port 39B. Vernier select circuit 136 receives the reference clock that accompanies the write data from clock bus 26 of synchronous bus 212 by way of line 46 and clock port 45. Given that the reference clock that accompanies the write data may be discontinuously supplied by clock bus 26 for brief durations that only cover the data transfer, the configuration of vernier select circuit 136 is provided a "slaved" vernier design similar to the exemplary block diagram of FIG. 5. In other words, the vernier delay portion 48 of "slaved" vernier select circuit 136 is controlled by way of a control signal $V_{tuneA}$ that has been generated by an inner delay lock loop of a remote compound delay lock loop for adjusting a separate, but similarly designed vernier. Referencing FIG. 21, vernier delay lock loop 182 incorporates an inner delay lock loop (see the description presented earlier with respect to FIG. 6) as part of the compound delay lock loop that provides the internal clock ICLK for latching the command data into command register 66. It is this inner delay lock loop of vernier 182 that provides the control signal $V_{tuneA}$ for adjusting the vernier 48 of "slaved" vernier select circuit 136. Accordingly, vernier 48 of vernier select circuit 136 is slaved per the control signal $V_{tuneA}$ of vernier 182.

Additionally, in a preferred, yet optional aspect of the present embodiment, a variable delay element 144' is disposed in the signal path of the data reference clock that precedes vernier 48, and comprises a circuit design substantially similar to that of variable delay element 144 of the remote compound delay lock loop. Variable delay element 144' receives a control signal $V_{tuneB}$ from the control loop of the outer delay lock loop of the compound architecture. Emulator circuit 186 of the remote compound delay lock loop, by emulating delays of the drivers and multiplexer 184 associated with the internal clock signal ICLK, likewise substantially emulates characteristics of similarly designed drivers and multiplexer 52 associated with propagating the data reference clock signal DCLKD to the clock input of the data registers 132. Accordingly, the control signal $V_{tuneB}$ that is used for adjusting variable delay element 144 of the compound delay lock loop will be substantially suitable for adjusting the delay of the variable delay element 144' of the vernier select circuit 136. In this fashion, transitions of the discontinuous data reference clock are maintained in synchronous, relative relationship to the data signal, and the clock transitions are kept substantially aligned to data eyes of the data signal at the data input of data register 132.

In accordance with an alternative embodiment of the present invention, the clock signal that accompanies the data signal may be continuous. For such memory applications which have a continuous write clock accompanying the write data, the vernier select circuit comprises a compound delay lock loop, e.g., of one of the previously described exemplary embodiments separate and independent of the delay lock loop that may be associated with receiving the command data.

Figure 21A:
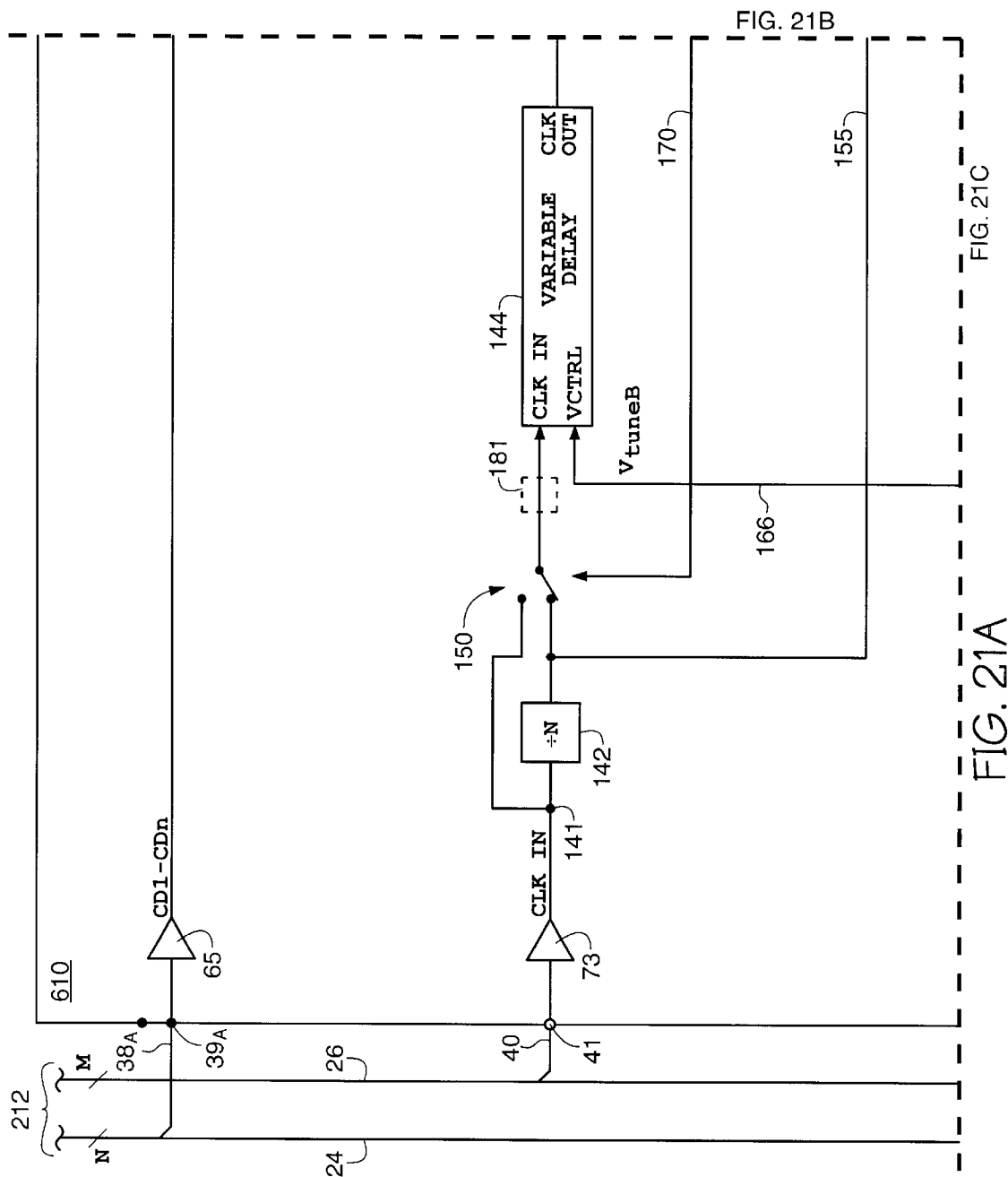
FIG. 21 consisting of FIGS. 21A–21D is a simplified block diagram representative of a synchronous memory device, incorporating a clock initialization and synchronization circuit for a write channel of the synchronous memory device in accordance with an exemplary embodiment of the present invention.
Figure 21D:
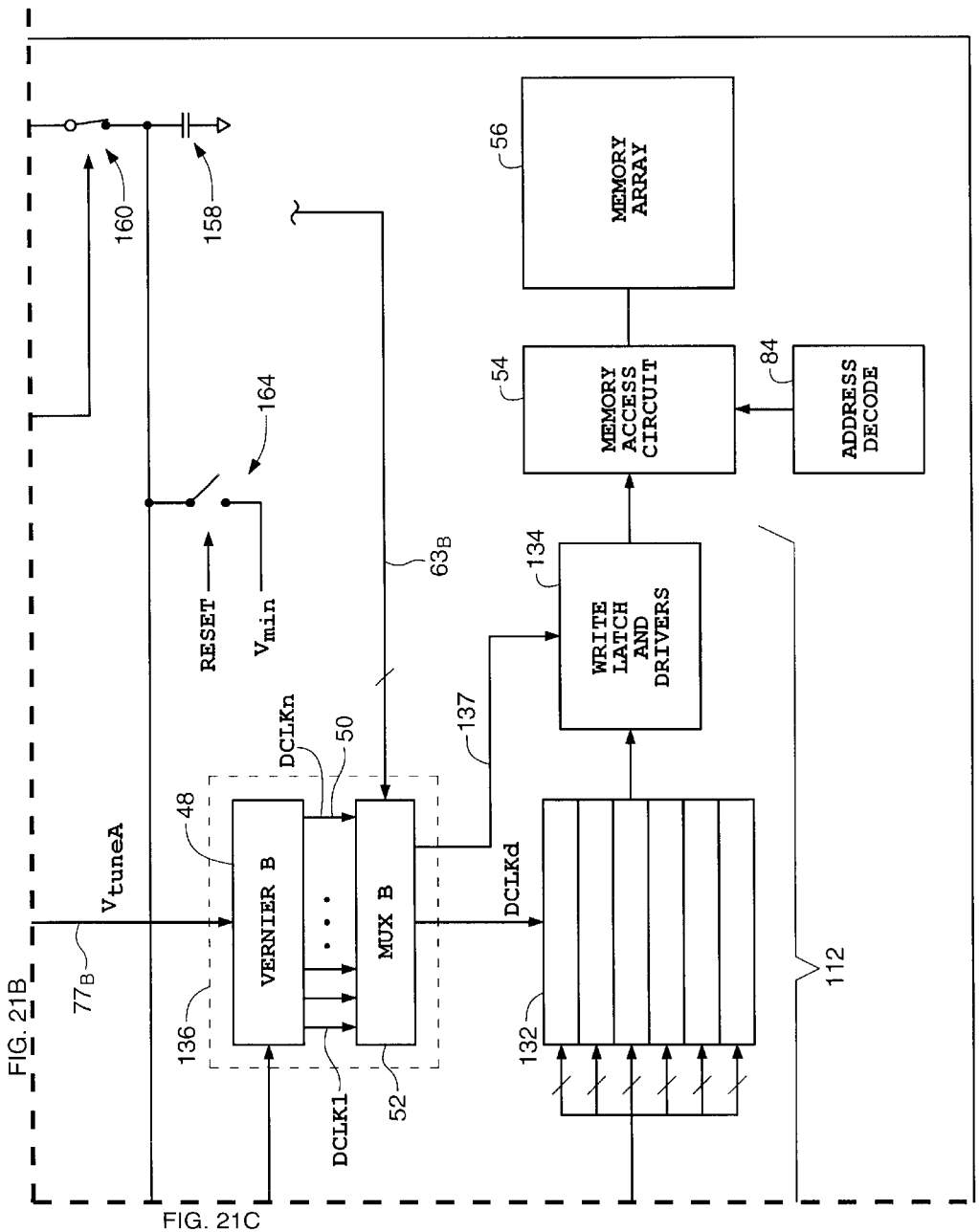

Further referencing FIG. 21, the compound delay lock loop is preferably initialized in accordance with one of the previously described, exemplary initialization sequences of the present invention, so that the variable delay element 144 is set to a middle region of its adjustable range. Accordingly, the delay lock loop can adjust the delay of the variable delay element 144 for accommodating increased delay fluctuations of any drivers and multiplexer 184 associated with propagating the selected clock signal to the latching registers. Additionally, vernier select circuit 136 preferably includes an additional output tap 137 configurable to select an optimally delayed representation of the received write clock for use in transferring and capturing data from the input registers 132 to the memory's Write Latch and Driver circuit 134. This additional output tap 137 of the vernier select circuit 136 can comprise a separate programmable channel of multiplexer 52.

Turning to the read data channel 110 of synchronous memory 610, with further reference to FIG. 20, address and decode circuit 84 provides address information to access circuitry 54 for obtaining data from memory array 56. This data is transferred into read latch 120, for example, as a 64 bit wide data-word. Read latch 120 presents the data to read FIFO circuit 124 by way of time division multiplexer 122, which multiplexer enables time division multiplexing of the data of latch 120 into four, serially presented, 16-bit data-words. Read FIFO circuit 124 sends this multiplexed data out, as clocked by read clock RCLK, to synchronous bus 212 via drivers 128, port 39B and data lines 38B. Likewise, a reference read clock is also sent to the synchronous bus 212 via drivers 128 to accompany the data transfer. Ideally, the clock transitions at the clock output terminal 48 coincide with those of the data signal at data output port 39B.

To facilitate and maintain synchronization between these signals, a delay lock loop corresponding to one of the exemplary embodiments of the present invention described earlier herein, e.g., relative to FIGS. 9A and 9B, is incorporated within a clock vernier portion of Read FIFO circuit 124. For this particular exemplary embodiment, the emulator circuit 186 of such compound delay lock loop is designed to simulate delays of the delay lock loop's multiplexer 184, the tri-state or other buffers associated with the delay lock loop's multiplexer 184, and drivers 128 of the read channel associated with propagating the data to the output port 39B. Additionally, it will be understood that the output drivers 128 may include conditioning circuits for shaping the data and clock signals prior their presentation to respective ports 39B, 45. In operation, initialization of the compound delay lock loop associated with the read clock will initialize the variable delay element 144 of the delay lock loop for setting it within a middle region of its operating range as set forth earlier herein. Accordingly, an increase in delay through the delay lock loop's buffers and multiplexer 184, the buffers of read FIFO circuit 124, and drivers 128 of the read channel over their ambient operating conditions, can be compensated by decreasing the delay of the delay lock loop's variable delay element 144.

Additional disclosure of the read and write channels 110 and 112 can be found in US application Ser. No. 08/879,847 filed Jun. 20, 1997, which is hereby incorporated by reference in its entirety.

Figure 22:
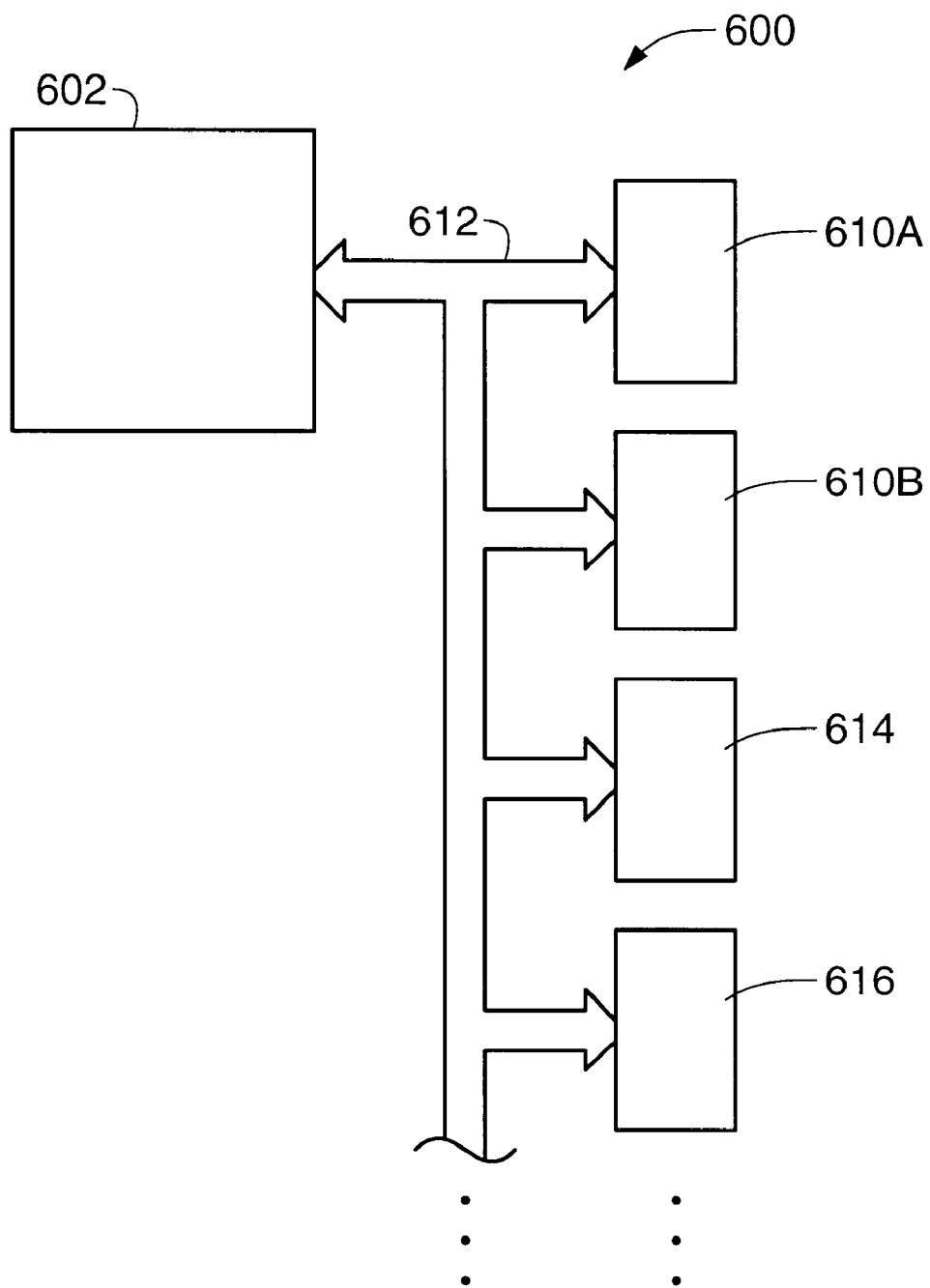
FIG. 22 is a block diagram of a computer system coupled to a synchronous network in accordance with an exemplary embodiment of the present invention.

In accordance with another embodiment of the present invention, referencing FIG. 22, a processing system 600 comprises a processor 602 coupled to a synchronous communication bus or network 612 that transfers data in synchronous relationship with associated write or read reference clock signals. The processing system will typically include I/O devices 614, e.g., such as a keypad and mouse, that are coupled to the bus by way of known, industry standard interconnect architectures. These I/O devices 614 allow an operator to interact with the processor system 600. Additionally, the processor system further comprises one or more output devices 616, such as a printer or video display, that are coupled to the bus using available bridge or expansion bus interfacing architectures. Synchronous memory devices 610A, 610B comprise one of the previously disclosed, exemplary synchronous memory embodiments of the present invention, and are configured to exchange data in synchronous relationship with associated read and write clock signals across bus 612. In operation, processor 602 exchanges data with synchronous memory devices 610A, 610B per the circuitry and methods disclosed previously herein relative to FIGS. 20 and 21. Sustaining the synchronization needs of the processor system, memory devices 610A, 610B incorporate the exemplary delay lock loops and initialization circuits disclosed previously. Such initialization and synchronization circuits can configure the memory to maintainable settings within the processor system 600 for providing reliable synchronous data transfer capabilities within the processor system over its ambient operating conditions.

What is claimed is:

1. A method of synchronizing a clock signal using a delay lock loop, comprising:

frequency dividing the clock signal to provide a divided signal;

coupling the divided signal to an input of a variable delay circuit, the variable delay circuit outputting a delayed signal;

comparing the divided signal to a phase of the delayed signal to generate a control signal;

applying the control signal to the variable delay circuit to control its delay; and after a duration, replacing the divided signal at the input of the variable delay circuit with the clock signal.

2. The method of claim 1, further comprising frequency dividing the delayed signal such that the comparing step compares signals of the same frequency.

3. The method of claim 1, wherein the duration is sufficient for enabling the delay lock loop to acquire lock with the divided signal at the input of the variable delay circuit.

4. The method of claim 1, further comprising an initially fixing said control signal to a reset value.

5. The method of claim 4, wherein the reset value sets the variable delay circuit to a minimum setting.

6. The method of claim 1, wherein the variable delay circuit includes a propagation delay.

7. The method of claim 1, wherein the control signal comprises an integrator.

8. The method of claim 1, wherein the control signal comprises a charge pump.

9. The method of claim 1, wherein comparing the divided signal to a phase of the delayed signal to generate a control signal involves assessing the phase difference between the divided signal and the delayed signal.

10. The method of claim 1, wherein the method produces the delayed signal such that it is synchronized with reading or writing of data to and from a memory array.

11. The method of claim 10, further comprising coupling the delayed signal to a vernier circuit to produce various delayed representations of the delayed signal.

12. The method of claim 11, further comprising selecting one of the delayed representations to synchronize the reading and writing.

13. The method of claim 12, wherein selecting is accomplished by a multiplexer.

14. The method of claim 1, wherein replacing the divided signal at the input of the variable delay circuit with the clock signal further comprises dividing the frequency of the delayed signal.

15. A method of locking a delay lock loop in synchronization with a clock signal, comprising:
    initializing a variable delay circuit within the delay lock loop to a minimum delay value, wherein the output of the variable delay circuit is coupled to a feedback loop, and wherein delay of the variable delay circuit is controlled by a control signal generated by a feedback loop;
    frequency dividing the clock signal and inputting it into the variable delay circuit;
    locking the frequency-divided clock signal by adjusting the control signal to the variable delay circuit; and
    undividing the frequency-divided clock signal.

16. The method of claim 15, further comprising coupling a frequency divider into the feedback loop after locking.

17. The method of claim 15, wherein the variable delay circuit includes a propagation delay.

18. The method of claim 15, wherein the feedback loop comprises a phase detector for comparing the phase difference between the clock signal and the output of the variable delay circuit.

19. The method of claim 18, further comprising an integrator coupled to the phase detector for producing the control signal.

20. The method of claim 15, wherein the output of the variable delay circuit is synchronized with reading or writing of data to and from a memory array.

21. The method of claim 20, further comprising coupling the delayed signal to a vernier circuit to produce various delayed representations of the delayed signal.

22. The method of claim 21, further comprising selecting one of the delayed representations to synchronize the reading and writing.

23. The method of claim 22, wherein selecting is accomplished by a multiplexer.

24. A delay lock loop circuit, comprising:
    a variable delay circuit configured to receive either a clock signal or a frequency divided version of the clock signal;
    a phase detector for receiving as inputs (i) either the output of the variable delay circuit or a frequency divided version of the output of the variable delay circuit, and (ii) the frequency divided version of the clock signal, and for producing a first signal indicative of the phase difference between the two phase detector inputs; and
    a feedback loop for receiving the first signal and for producing a control signal;
    wherein the control signal is received by the variable delay circuit to adjust the delay of the variable delay circuit.

25. The circuit of claim 24, wherein the variable delay circuit includes a propagation delay.

26. The circuit of claim 24, wherein the feedback loop comprises an integrator coupled to the first signal for producing the control signal.

27. The circuit of claim 24, wherein the output of the variable delay circuit is synchronized with reading or writing of data to and from a memory array.

28. The circuit of claim 27, further comprising a vernier circuit coupled between the variable delay circuit and the phase detector for producing various delayed representations of the output of the variable delay circuit.

29. The circuit of claim 28, further comprising a multiplexer for selecting one of the delayed representations to synchronize the reading and writing.

30. The circuit of claim 24, further comprising a lock sequencer circuit, wherein the lock sequencer circuit receives a representation of the clock signal and produces a signal to control whether the variable delay circuit receives the clock signal or the frequency divided version of the clock signal.

31. The circuit of claim 24, further comprising a lock sequencer circuit, wherein the lock sequencer circuit receives a representation of the clock signal and produces a signal to control whether the phase detector receives the output of the variable delay circuit or a frequency divided version of the output of the variable delay circuit.

32. The circuit of claim 24, further comprising a lock sequencer circuit, wherein the lock sequencer circuit can interrupt the control signal.

33. The circuit of claim 24, wherein the control signal is resettable to a minimum value.

34. A memory device accessible by a first clock signal, comprising:
    a memory array accessible by a second clock signal; and
    a delay lock loop for synchronizing the second clock signal with the first clock signal, comprising:
        a variable delay circuit for producing the second clock signal, wherein the variable delay circuit is configured to receive either the first clock signal or a frequency divided version of the first clock signal;
        a phase detector for receiving as inputs (i) either the second clock signal or a frequency divided version of the second clock signal, and (ii) the frequency divided version of the first clock signal, and for producing a first signal indicative of the phase difference between the two phase detector inputs; and
        a feedback loop for receiving the first signal and for producing a control signal;
        wherein the control signal is received by the variable delay circuit to adjust the delay of the variable delay circuit.

35. The device of claim 34, wherein the variable delay circuit includes a propagation delay.

36. The device of claim 34, wherein the feedback loop comprises an integrator coupled to the first signal for producing the control signal.

37. The device of claim 34, further comprising a vernier circuit coupled between the variable delay circuit and the phase detector for producing various delayed representations of the second clock signal.

38. The device of claim 37, further comprising a multiplexer for selecting one of the delayed representations of the second clock signal.

39. The device of claim 34, further comprising a lock sequencer circuit, wherein the lock sequencer circuit receives a representation of the first clock signal and produces a signal to control whether the variable delay circuit receives the first clock signal or the frequency divided version of the first clock signal.

40. The device of claim 34, further comprising a lock sequencer circuit, wherein the lock sequencer circuit receives a representation of the first clock signal and produces a signal to control whether the phase detector receives the second clock signal or a frequency divided version of the second clock signal.

41. The device of claim 34, further comprising a lock sequencer circuit, wherein the lock sequencer circuit can interrupt the control signal.

42. The device of claim 34, wherein the control signal is resettable to a minimum value.

43. A system, comprising:
   a microprocessor for producing a first clock signal;
   a memory device for receiving the first clock signal, the memory device comprising a memory array accessible by a second clock signal; and
   a delay lock loop for synchronizing the second clock signal with the first clock signal, comprising:
      a variable delay circuit for producing the second clock signal, wherein the variable delay circuit is configured to receive either the first clock signal or a frequency divided version of the first clock signal;
      a phase detector for receiving as inputs (i) either the second clock signal or a frequency divided version of the second clock signal, and (ii) the frequency divided version of the first clock signal, and for producing a first signal indicative of the phase difference between the two phase detector inputs; and
      a feedback loop for receiving the first signal and for producing a control signal;
      wherein the control signal is received by the variable delay circuit to adjust the delay of the variable delay circuit.

44. The system of claim 43, wherein the variable delay circuit includes a propagation delay.

45. The system of claim 43, wherein the feedback loop comprises an integrator coupled to the first for producing the control signal.

46. The system of claim 43, further comprising a vernier circuit coupled between the variable circuit and the phase detector for producing various delayed representations of the second signal.

47. The system of claim 46, further comprising a multiplexer for selecting one of the delayed representations of the second clock signal.

48. The system of claim 43, further comprising a lock sequencer circuit, wherein the lock sequencer circuit receives a representation of the first clock signal and produces a signal to control whether the variable delay circuit receives the first clock signal or the frequency divided version of the first clock signal.

49. The system of claim 43, further comprising a lock sequencer circuit, wherein the lock sequencer circuit receives a representation of the first clock signal and produces a signal to control whether the phase detector receives the second clock signal or a frequency divided version of the second clock signal.

50. The system of claim 43, further comprising a lock sequencer circuit, wherein the lock sequencer circuit can interrupt the control signal.

51. The system of claim 43, wherein the control signal is resettable to a minimum value.

* * * * *